(12) United States Patent
Lee et al.

(10) Patent No.: US 10,928,573 B2
(45) Date of Patent: Feb. 23, 2021

(54) PATTERN STRUCTURE AND METHOD OF MANUFACTURING THE PATTERN STRUCTURE

(71) Applicant: SAMSUNG ELECTRONICS CO., LTD., Suwon-si (KR)

(72) Inventors: Sunghoon Lee, Seoul (KR); Joonyong Park, Suwon-si (KR); Dongouk Kim, Pyeongtaek-si (KR); Jihyun Bae, Seoul (KR); Bongsu Shin, Seoul (KR); Dongsik Shim, Hwaseong-si (KR); Jaeseung Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/858,129

(22) Filed: Apr. 24, 2020

(65) Prior Publication Data
US 2020/0249384 A1 Aug. 6, 2020

Related U.S. Application Data

(62) Division of application No. 15/646,836, filed on Jul. 11, 2017, now Pat. No. 10,677,974.

(30) Foreign Application Priority Data

Oct. 24, 2016 (KR) .................. 10-2016-0138637

(51) Int. Cl.
*G02B 5/30* (2006.01)
*G03F 7/00* (2006.01)
(Continued)

(52) U.S. Cl.
CPC .......... *G02B 5/3058* (2013.01); *B28D 5/022* (2013.01); *G03F 7/0002* (2013.01);
(Continued)

(58) Field of Classification Search
CPC ....... B82Y 40/00; B82Y 30/00; G03F 7/0002; B29D 11/00; B29D 11/00336
(Continued)

(56) References Cited

U.S. PATENT DOCUMENTS 6,393,685 B1 * 5/2002 Collins ................ B81C 3/008
 156/257
6,406,636 B1 * 6/2002 Vaganov .............. B23K 1/0016
 216/2

(Continued)

FOREIGN PATENT DOCUMENTS

EP 2995995 A2 3/2016
EP 2995995 A3 3/2016
(Continued)

OTHER PUBLICATIONS

Communication dated Mar. 5, 2018, issued by the European Patent Office in counterpart European Patent Application No. 17187814.3.
(Continued)

*Primary Examiner* — Jonathan Han
(74) *Attorney, Agent, or Firm* — Sughrue Mion, PLLC

(57) ABSTRACT

A method for manufacturing a pattern structure includes preparing a wafer that has a plurality of fine patterns, generating a first trench by processing the wafer from a first surface to a first depth, and generating a second trench connected to the first trench by processing the wafer from a second surface which is opposite to the first surface to a second depth, thereby cutting the wafer.

8 Claims, 25 Drawing Sheets

(51) Int. Cl.
*B28D 5/02* (2006.01)
*G02F 1/1335* (2006.01)

(52) U.S. Cl.
CPC ...... *G03F 7/0007* (2013.01); *G02F 1/133528* (2013.01); *G02F 2001/133548* (2013.01)

(58) Field of Classification Search
USPC .......................... 216/41, 52, 2, 24; 438/700
See application file for complete search history.

(56) References Cited

U.S. PATENT DOCUMENTS

| | | | | |
|---|---|---|---|---|
| 8,865,288 | B2* | 10/2014 | Bhandari | A61M 37/0015 428/120 |
| 9,348,553 | B2 | 5/2016 | Curtis et al. | |
| 2001/0023979 | A1 | 9/2001 | Brouvillette et al. | |
| 2006/0057777 | A1 | 3/2006 | Howell et al. | |
| 2009/0314414 | A1* | 12/2009 | Verschuuren | G03F 7/0002 156/64 |
| 2013/0153534 | A1 | 6/2013 | Resnick et al. | |
| 2014/0017614 | A1 | 1/2014 | Schaper | |
| 2014/0093692 | A1 | 4/2014 | Miyazawa et al. | |
| 2016/0049333 | A1 | 2/2016 | Minamiru et al. | |
| 2016/0059473 | A1 | 3/2016 | Ermochkine et al. | |

FOREIGN PATENT DOCUMENTS

| | | |
|---|---|---|
| EP | 3199987 A1 | 8/2017 |
| JP | 3584539 B2 | 11/2004 |
| KR | 10-2012-0082266 A | 7/2012 |
| KR | 10-2016-0016254 A | 2/2016 |
| KR | 10-2017-0091439 A | 8/2017 |

OTHER PUBLICATIONS

Disco Corporation, "Fully Automatic Dicing Saw DFD6361", Advanced performance for 300 mm dicing, Nov. 2014, total 2 pages.
Communication dated Mar. 19, 2020, issued by European Patent Office in counterpart European Patent Application No. 17 187 814.3.

* cited by examiner

UV or heat

PATTERN STRUCTURE AND METHOD OF MANUFACTURING THE PATTERN STRUCTURE

CROSS-REFERENCE TO RELATED APPLICATION

This application is a divisional application of U.S. application Ser. No. 15/646,836 filed Jul. 11, 2017, which claims priority from Korean Patent Application No. 10-2016-0138637, filed on Oct. 24, 2016, in the Korean Intellectual Property Office, the disclosure of which is incorporated herein by reference in its entirety.

BACKGROUND

1. Field

Exemplary embodiments relate to pattern structures and methods of manufacturing the pattern structures.

2. Description of the Related Art

As representative image display apparatuses, liquid crystal display (LCD) apparatuses are being developed to have larger sizes, higher resolutions, and three-dimensional (3D) functions. To satisfy these technical requirements, attempts are currently made to employ a nanoscale functional structure in an LCD structure. For example, when a nanoscale grid is formed on a surface of a backlight unit located under an LCD panel, light emitted from the surface of the backlight unit may acquire directivity due to a diffraction phenomenon, and thus a glassless 3D television (TV) may be implemented. In addition, when an absorptive polarizing film of the LCD panel is replaced by a wire grid polarizer, brightness may be increased and thus a high resolution may be achieved.

To employ the nanoscale functional structure in the LCD structure, a technology of forming semiconductor-level fine wires on a display-level large area is necessary. For example, a tiling technology is a technology which entails manufacturing a large-area pattern structure by forming a fine structure on a unit pattern structure having a semiconductor-processable size, and physically bonding a plurality of unit pattern structures to each other. A stamp may be produced by using the formed pattern structure as a master mold, and a large-area nanoscale grid or a wire grid polarizer may be manufactured by using an imprinting technology.

However, in the tiling technology that is implemented by using physical bonding, seams are generated between the unit pattern structures. When a large-area nanoscale grid or a wire grid polarizer is manufactured using the pattern structure manufactured using the tiling technology, if the seams are larger than a certain size, defects may be visible on a screen of a display panel.

SUMMARY

Provided are pattern structures and methods of manufacturing the pattern structures.

Additional aspects will be set forth in part in the description which follows and, in part, will be apparent from the description, or may be learned by practice of the presented exemplary embodiments.

According to an aspect of an exemplary embodiment, a method for manufacturing a pattern structure includes preparing a wafer that has a plurality of fine patterns, forming a first trench by processing the wafer from a first surface to a first depth, and forming a second trench connected to the first trench by processing the wafer from a second surface which is opposite to the first surface to a second depth, thereby cutting the wafer.

Each of the plurality of fine patterns may be formed on the first surface of the wafer.

A cut surface of the pattern structure may include a first cut surface defined by the first trench and a second cut surface defined by the second trench. The first trench may have a width which is less than a width of the second trench such that the first cut surface may protrude outward as compared with the second cut surface.

An angle between the first surface and the first cut surface may be equal to or less than 90°. The first depth may be less than the second depth.

The first trench may be formed by using a first blade, and the second trench may be formed by using a second blade. The first blade may have a thickness which is less than a thickness of the second blade.

The first blade may process the wafer by providing cutting faces thereof to be perpendicular or diagonal to the first surface of the wafer. The second blade may process the wafer by providing cutting faces thereof to be perpendicular or diagonal to the second surface of the wafer.

According to an aspect of another exemplary embodiment, a pattern structure includes a first surface that has a plurality of fine patterns thereon and a second surface which is opposite to the first surface, and a first cut surface located adjacent to the first surface, and a second cut surface located adjacent to the second surface, wherein each of the first and second cut surfaces is provided on at least one side surface between the first and second surfaces, wherein the first cut surface protrudes outward as compared with the second cut surface, and wherein an angle between the first surface and the first cut surface is equal to or less than 90°.

The first cut surface may have a thickness which is less than a thickness of the second cut surface.

According to an aspect of another exemplary embodiment, a method for manufacturing a pattern structure includes preparing each of a plurality of component pattern structures, and bonding the component pattern structures together, wherein the preparing of each respective component pattern structure includes preparing a wafer that has a plurality of fine patterns on a first surface, forming a first trench by processing the wafer from the first surface to a first depth, and forming a second trench connected to the first trench by processing the wafer from a second surface which is opposite to the first surface to a second depth, thereby cutting the wafer.

A cut surface of each respective component pattern structure may include a first cut surface defined by the first trench and a second cut surface defined by the second trench, and the first cut surface may protrude outward as compared with the second cut surface.

An angle between the first surface and the first cut surface may be equal to or less than 90°.

The first trench may be formed by using a first blade, and the second trench may be formed by using a second blade. The first blade may process the wafer by providing cutting faces thereof to be perpendicular or diagonal to the first surface of the wafer.

The bonding of the component pattern structures together may include providing the component pattern structures on a substrate, depositing a liquid photocurable resin or a thermosetting resin between respective pairs of the component pattern structures, positioning each of the component pattern structures within a predetermined proximity with respect to an adjacent component pattern structure, and causing the liquid photocurable resin or the thermosetting resin to harden by using ultraviolet (UV) light or heat.

The providing of the component pattern structures on the substrate may include positioning each of the component pattern structures such that each cut surface of each of the component pattern structures faces a cut surface of an adjacent component pattern structure.

The positioning of each the component pattern structures may include aligning the component pattern structures by moving each of the component pattern structures so as to position each of the cut surfaces of each of the component pattern structures within the predetermined proximity with respect to the adjacent component pattern structure.

The liquid photocurable resin or thermosetting resin may be dispersed between, on, and under each of the component pattern structures when the component pattern structures are positioned within the predetermined proximity with respect to the adjacent component pattern structure. The method may further include providing a base layer on each of the component pattern structures in order to cover the component pattern structures, and pressing the base layer in order to equalize respective heights of the fine patterns of the component pattern structures.

The aligning of the component pattern structures may include preparing positioners to adjust respective locations of the component pattern structures, moving the component pattern structures by using the positioners, and monitoring relative locations between the component pattern structures moved by the positioners.

Flat zones of the component pattern structures may be guided by using a flat plate when the component pattern structures are aligned.

According to an aspect of another exemplary embodiment, a pattern structure includes a plurality of component pattern structures bonded together and each including a first surface that has a plurality of fine patterns thereon and a second surface which is opposite to the first surface, and a first cut surface located adjacent to the first surface, and a second cut surface located adjacent to the second surface, wherein each of the first cut surface and the second cut surface is provided on at least one side surface between the first and second surfaces, where the component pattern structures are bonded to each other, wherein the first cut surface protrudes outward as compared with the second cut surface, and wherein an angle between the first surface and the first cut surface is equal to or less than 90°.

The first cut surface may have a thickness which is less than a thickness of the second cut surface.

The pattern structure may further include a resin layer prepared between and under each of the component pattern structures.

The fine patterns of the component pattern structures may have equal heights. A minimum gap between the unit pattern structures may be greater than 0 μm and less than 10 μm.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
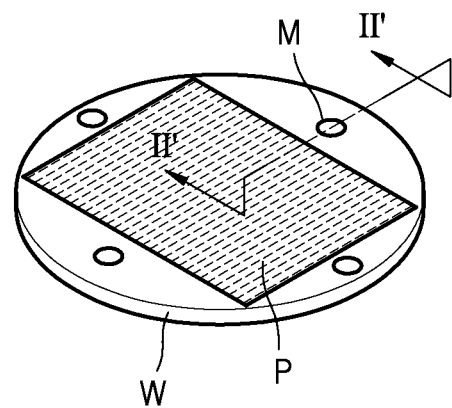
FIGS. 1 to 11 are diagrams for describing a method for manufacturing a unit pattern structure, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects.

FIGS. 1 to 11 are diagrams for describing a method for manufacturing a unit pattern structure (also referred to herein as a "component pattern structure") 10, according to an exemplary embodiment.

Figure 2:
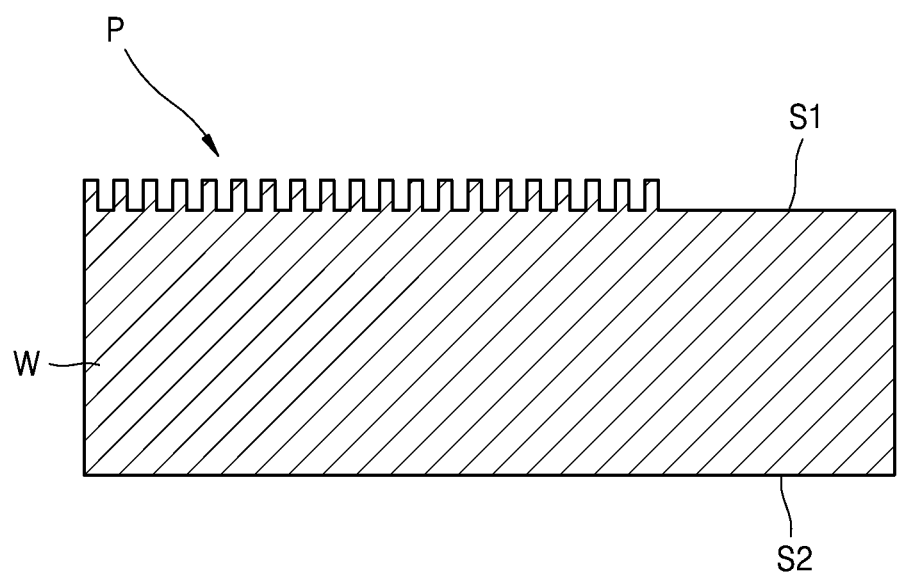

FIG. 1 is a perspective view of a wafer W that has a plurality of fine patterns P formed thereon, and FIG. 2 is a cross-sectional view taken along a line of FIG. 1. FIG. 2 illustrates no alignment marks M for the sake of convenience.

Referring to FIGS. 1 and 2, the wafer W having the fine patterns P formed thereon is prepared. For example, a silicon wafer may be used as the wafer W. However, the wafer W is not limited thereto and a compound semiconductor wafer, a sapphire wafer, or the like may also be used. The wafer W may have a thickness of about several hundred μm, e.g., about 750 μm. However, the above-mentioned thickness is merely an example, and the wafer W may have various thicknesses. The wafer W may include a first surface S1 (e.g., a top surface) and a second surface S2 which is opposite to the first surface S1 (e.g., a bottom surface). The first and second surfaces S1 and S2 may be parallel to each other.

The fine patterns P may be formed on the first surface S1 of the wafer W by using a general semiconductor patterning process, such as, for example, lithography and/or etching. The fine patterns P may have, for example, a nanoscale of several nm to several hundred nm, but is not limited thereto.

The fine patterns P may have a microscale of several μm to several hundred μm as necessary.

One or more alignment marks M may be formed on a region of the wafer W at which the fine patterns P are not formed. For example, the fine patterns P may be formed on a rectangular region of a circular wafer W, and a plurality of alignment marks M may be formed on a peripheral region of the fine patterns P. The alignment marks M may be formed when the fine patterns P are formed by using a semiconductor process.

Figure 3:
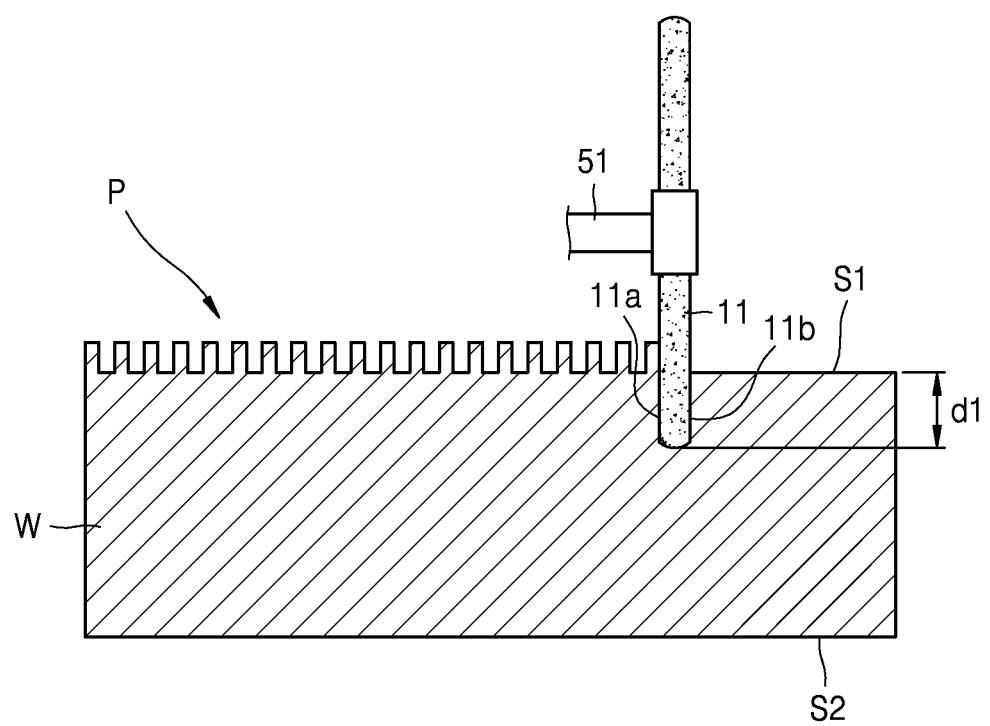
Figure 4:
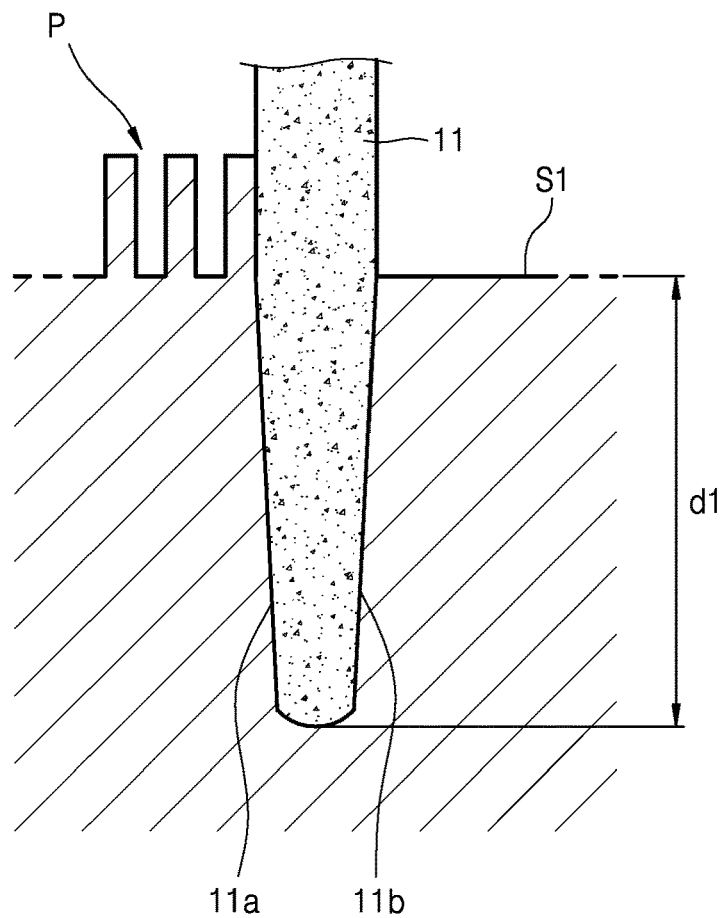

FIG. 3 illustrates that the first surface S1 of the wafer W is processed by using a first blade 11, and FIG. 4 is a magnified view of the first blade 11 of FIG. 3.

Referring to FIGS. 3 and 4, the first blade 11 is connected to a first rotation shaft 51, and the first rotation shaft 51 is caused to rotate by a driving motor (not shown). When the first rotation shaft 51 rotates, the first blade 11 may rotate. The first surface S1 of the wafer W may be processed by bringing the rotating first blade 11 into contact with the first surface S1 of the wafer W.

The first blade 11 may have a thickness which is less than that of a second blade 12 to be described below. For example, the first blade 11 may have a thickness of about several tens of μm, but is not limited thereto. The first blade 11 may be provided at a desired location on the first surface S1 in order to process the first surface S1 of the wafer W.

The first blade 11 may process the wafer W from the first surface S1 to a first depth d1. The first blade 11 may process the wafer W by the first depth d1 equal to or less than about 150 μm in a direction that is perpendicular to the first surface S1, but is not limited thereto. The first rotation shaft 51 may be provided in parallel to the first surface S1 of the wafer W, but is not limited thereto.

As illustrated in FIG. 4, the first blade 11 may have a gradually decreasing thickness toward an edge thereof. As such, first and second cutting faces 11a and 11b of the first blade 11 may be slightly diagonal (i.e., angled) with respect to the direction that is perpendicular to the first surface S1.

Figure 5:
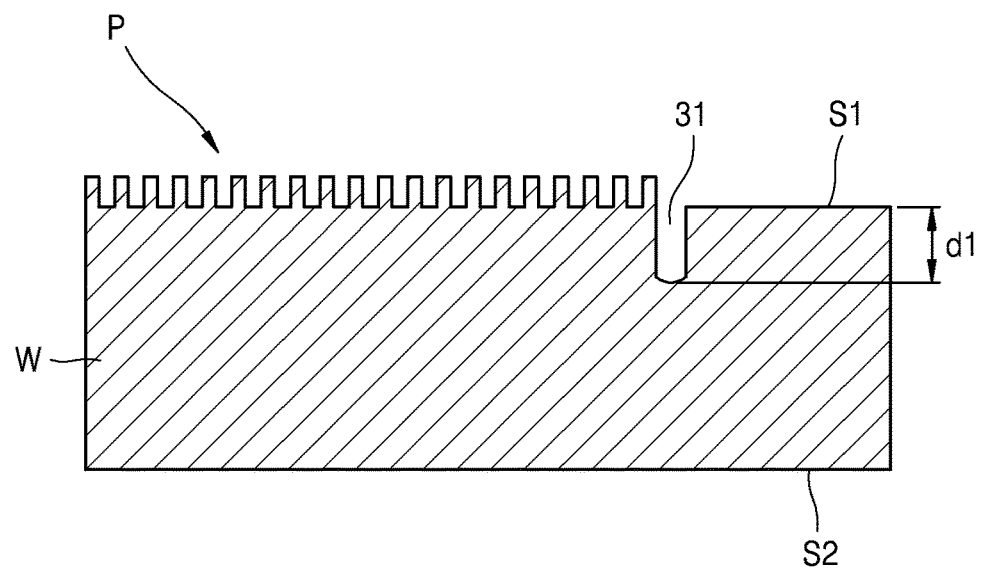
Figure 6:
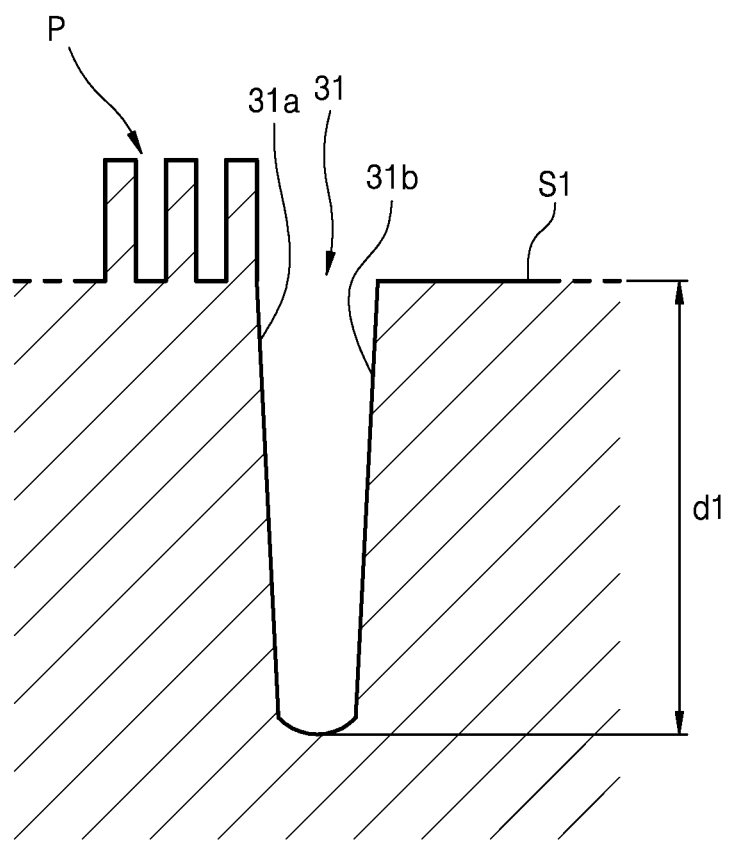

FIG. 5 illustrates that a first trench 31 is formed in the first surface S1 of the wafer W, and FIG. 6 is a magnified view of the first trench 31 of FIG. 5.

Referring to FIGS. 5 and 6, when the first blade 11 moves along a predetermined processing line (not shown) while processing the first surface S1 of the wafer W to the first depth d1, the first trench 31 may be formed. The first trench 31 may be formed to a width that corresponds to the thickness of the first blade 11, e.g., a width of about several tens of μm, and a depth equal to or less than about 150 μm, but is not limited thereto.

The first trench 31 may include first and second inner wall surfaces 31a and 31b which respectively correspond to the first and second cutting faces 11a and 11b of the first blade 11. Since the first and second cutting faces 11a and 11b of the first blade 11 are slightly diagonal with respect to the direction which is perpendicular to the first surface S1, the first and second inner wall surfaces 31a and 31b of the first trench 31 may also be slightly diagonal with respect to the direction which is perpendicular to the first surface S1. The first inner wall surface 31a of the first trench 31 may serve as a first cut surface CS1 of the unit pattern structure 10 (see FIG. 9) as will be described below.

Figure 7:
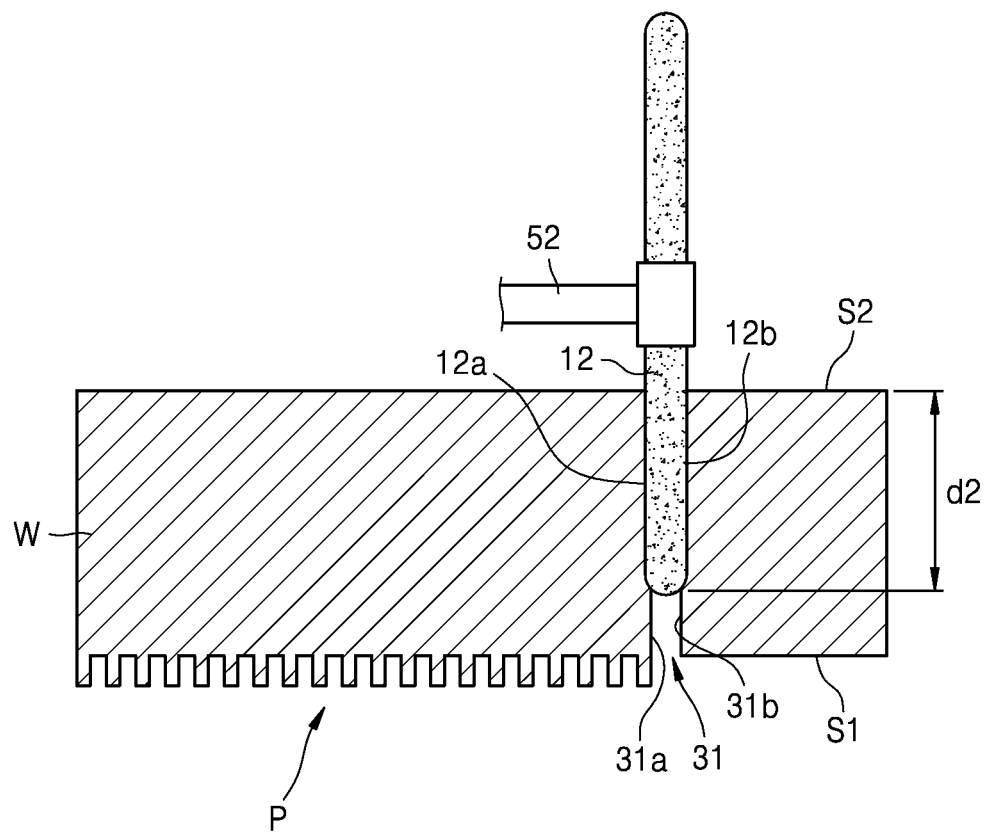

FIG. 7 illustrates that the second surface S2 of the wafer W is processed by using the second blade 12.

Referring to FIG. 7, the second blade 12 is connected to a second rotation shaft 52, and the second rotation shaft 52 is caused to rotate by a driving motor (not shown). When the second rotation shaft 52 rotates, the second blade 12 may rotate. The second surface S2 of the wafer W may be processed by bringing the rotating second blade 12 into contact with the second surface S2 of the wafer W. The second blade 12 may process a part of the second surface S2 of the wafer W in correspondence to the first trench 31, and may have a thickness which is greater than that of the first blade 11. For example, the second blade 12 may have a thickness of about several tens of μm to about several hundred μm, but is not limited thereto.

The second blade 12 may process the wafer W from the second surface S2 to a second depth d2. In particular, the second blade 12 may process the wafer W from the second surface S2 to a depth at which the first trench 31 is formed, and the second depth d2 may be greater than the first depth d1. For example, the second depth d2 may be equal to or greater than about 600 μm, but is not limited thereto. The second rotation shaft 52 may be provided in parallel to the second surface S2 of the wafer W in such a manner that the second blade 12 cuts the second surface S2 of the wafer W in a direction which is perpendicular to the second surface S2, but is not limited thereto.

Similarly as the first blade 11, the second blade 12 may have a gradually decreasing thickness toward an edge thereof. As such, first and second cutting faces 12a and 12b of the second blade 12 may be slightly diagonal (i.e., angled) with respect to the direction which is perpendicular to the second surface S2.

Figure 8:
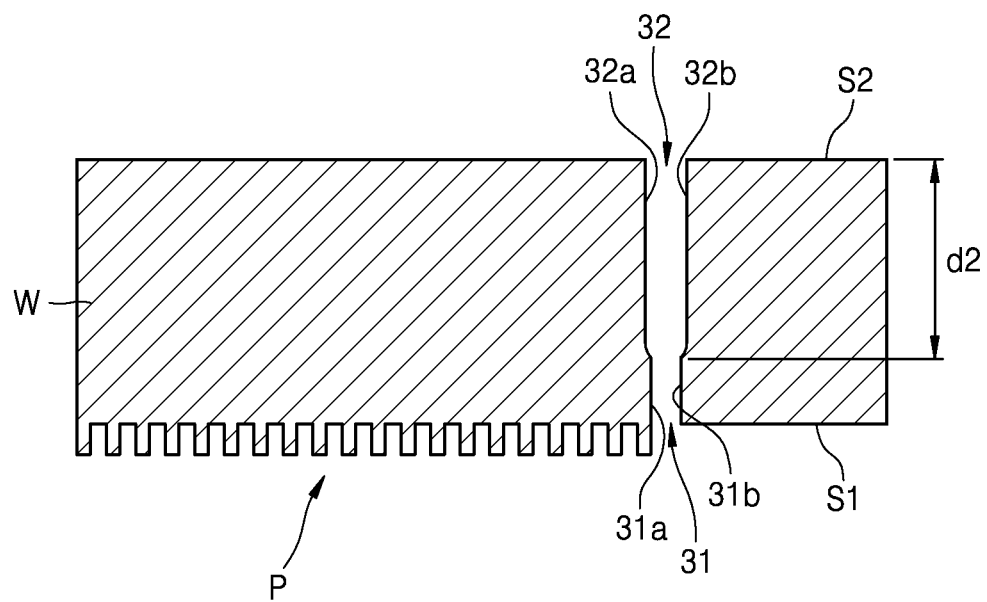

FIG. 8 illustrates that a second trench 32 is formed in the second surface S2 of the wafer W.

Referring to FIG. 8, when the second blade 12 moves along a predetermined processing line (not shown) while processing the second surface S2 of the wafer W to the second depth d2, the second trench 32 may be formed. Herein, the second trench 32 may be formed to, for example, a depth that is equal to or greater than about 600 μm in order to be connected to the first trench 31, but is not limited thereto.

The second trench 32 may be formed to a width that corresponds to the thickness of the second blade 12. Since the thickness of the second blade 12 is greater than that of the first blade 11, the width of the second trench 32 may be greater than that of the first trench 31. For example, the second trench 32 may have a width of about several tens of μm to about several hundred μm, but is not limited thereto.

The second trench 32 may include first and second inner wall surfaces 32a and 32b which respectively correspond to the first and second cutting faces 12a and 12b of the second blade 12. Since the first and second cutting faces 12a and 12b of the second blade 12 are slightly diagonal with respect to the direction which is perpendicular to the second surface S2, the first and second inner wall surfaces 32a and 32b of the second trench 32 may also be slightly diagonal with respect to the direction which is perpendicular to the second surface S2. The first inner wall surface 32a of the second trench 32 may serve as a second cut surface CS2 of the unit pattern structure 10 as will be described below. As described above, the wafer W may be cut by forming the second trench 32 to be connected to the first trench 31, and thus the unit pattern structure 10 may be manufactured.

Figure 9:
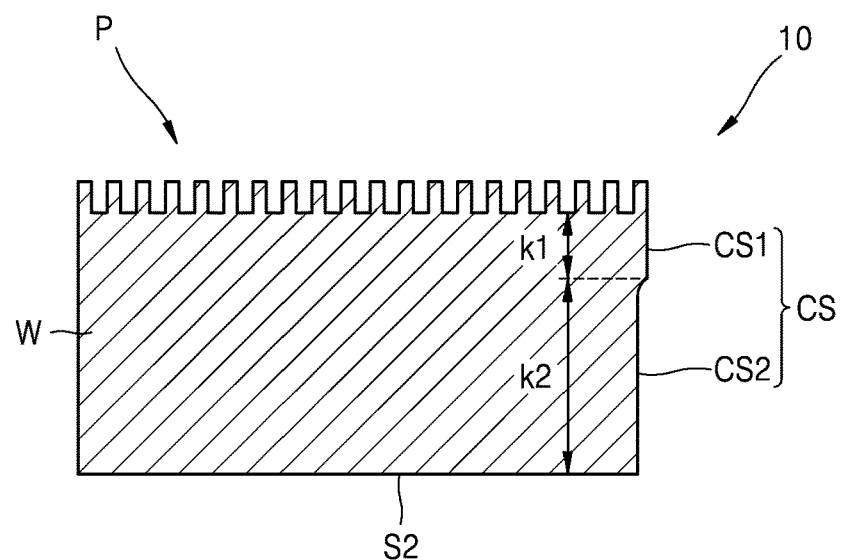
Figure 10:
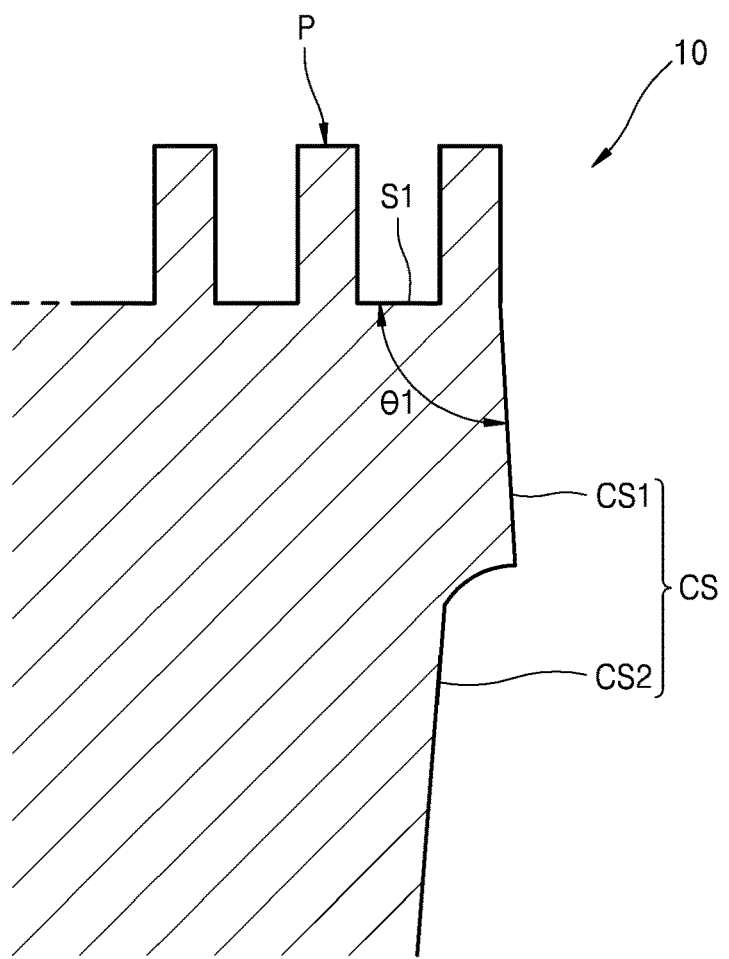
Figure 11:
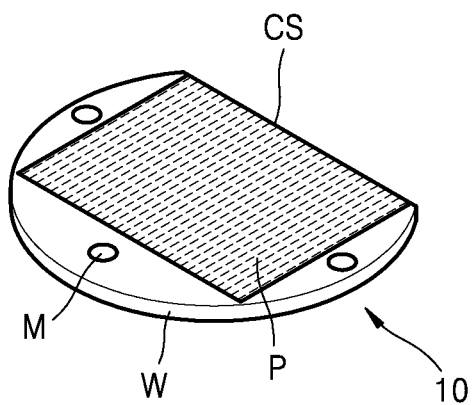

FIG. 9 is a cross-sectional view of the manufactured unit pattern structure 10, and FIG. 10 is a magnified view of a part near a cut surface CS of the unit pattern structure 10 illustrated in FIG. 9. FIG. 11 is a perspective view of the manufactured unit pattern structure 10.

Referring to FIGS. 9, 10, and 11, the cut surface CS of the unit pattern structure (also referred to herein as the "component pattern structure") 10 may include the first and second cut surfaces CS1 and CS2. The first cut surface CS1 may be defined by the first inner wall surface 31a of the first trench 31, and the second cut surface CS2 may be defined by the first inner wall surface 32a of the second trench 32.

Since the depth of the first trench 31 is less than that of the second trench 32, a thickness k1 of the first cut surface CS1 formed by the first trench 31 may be less than a thickness k2 of the second cut surface CS2 formed by the second trench 32. For example, the thickness k1 of the first cut surface CS1 may be equal to or less than about 150 μm, and the thickness k2 of the second cut surface CS2 may be equal to or greater than about 600 μm. However, the above-mentioned thicknesses are merely examples, and the thickness k1 of the first cut surface CS1 and the thickness k2 of the second cut surface CS2 may be varied. In addition, since the width of the second trench 32 is greater than that of the first trench 31, the first cut surface CS1 defined by the first inner wall surface 31a of the first trench 31 may protrude outward as compared with the second cut surface CS2 defined by the first inner wall surface 32a of the second trench 32.

In the unit pattern structure 10, an angle θ1 between the first surface S1 and the first cut surface CS1 may be slightly greater than 90°. As described above, the first cut surface CS1 is formed by using the first and second cutting faces 11a and 11b of the first blade 11, which are slightly diagonal (i.e., angled) with respect to the direction which is perpendicular to the first surface S1. Thus, as illustrated in FIG. 10, the angle θ1 between the first surface S1 and the first cut surface CS1 may be slightly greater than 90°. In addition, the second cut surface CS2 is formed by using the first and second cutting faces 12a and 12b of the second blade 12, which are slightly diagonal (i.e., angled) with respect to the direction which is perpendicular to the second surface S2. Thus, the second cut surface CS2 may also be slightly diagonal to the direction which is perpendicular to the second surface S2.

A pattern structure may be manufactured by manufacturing the above-described unit pattern structure 10 in a plural number, and then bonding the unit pattern structures 10 together. In the above description, the unit pattern structure 10 is manufactured by cutting only a single side of the wafer W. However, the current exemplary embodiment is not limited thereto and the unit pattern structure 10 may be manufactured by cutting multiple sides of the wafer W.

As described above, the first surface S1 of the wafer W may be processed by using the first blade 11 to form the first trench 31, and the second surface S2 of the wafer W may be processed by using the second blade 12, which is thicker than the first blade 11, to form the second trench 32, thereby manufacturing the unit pattern structure 10. When a large-area pattern structure is manufactured by bonding the unit pattern structures 10 together by using a tiling technology to be described below, seams between adjacent pairs of the unit pattern structures 10 may be minimized.

Figure 12:
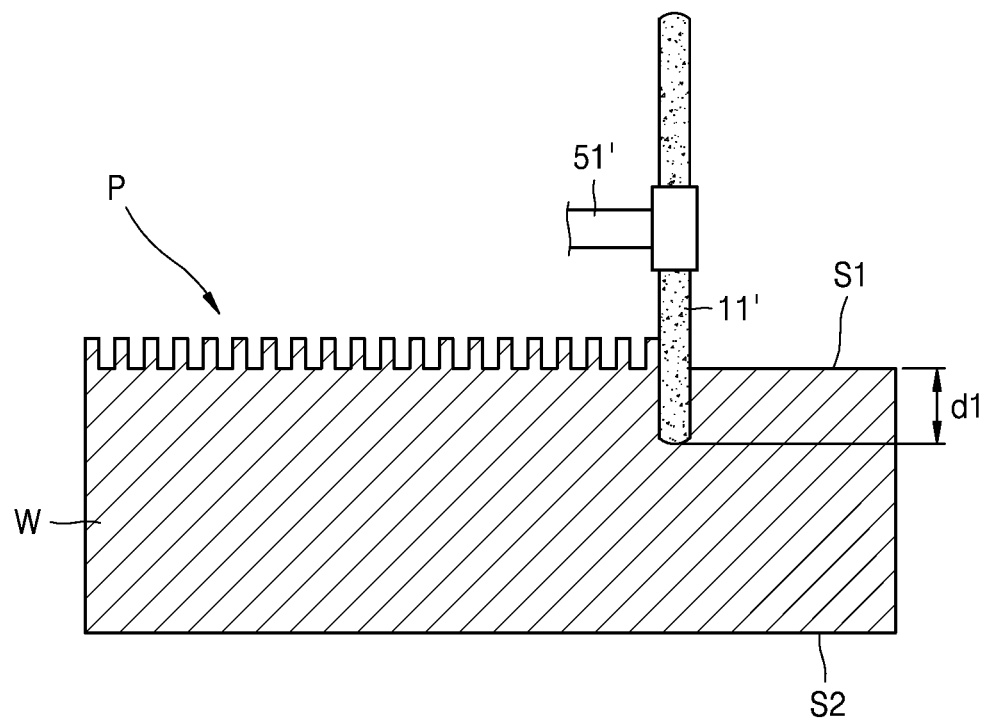
FIGS. 12 to 14 are diagrams for describing a method for manufacturing a unit pattern structure, according to another exemplary embodiment.
Figure 13:
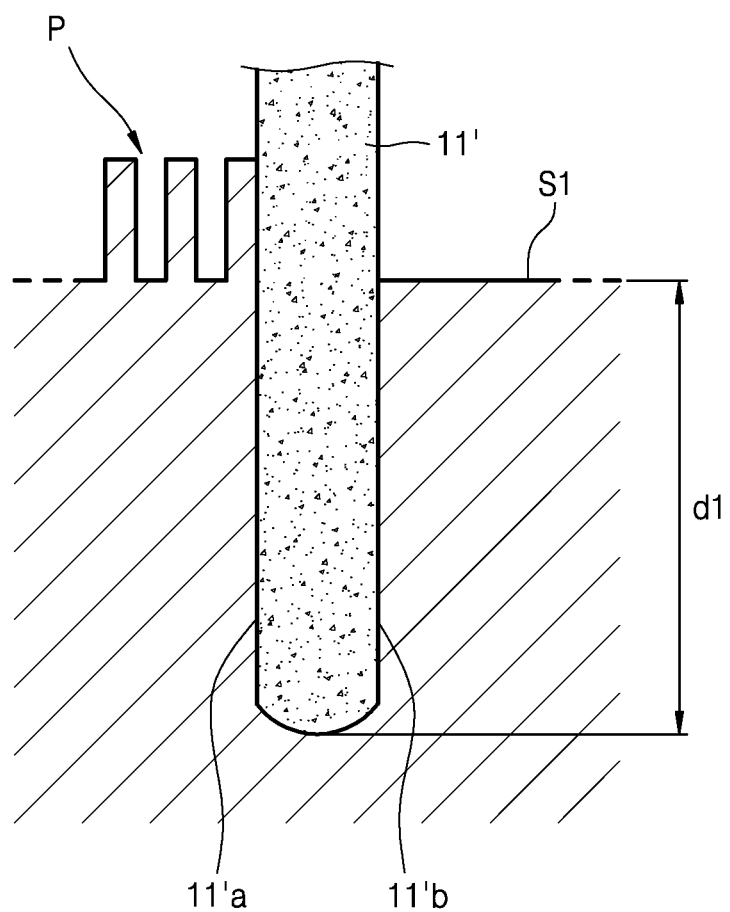
Figure 14:
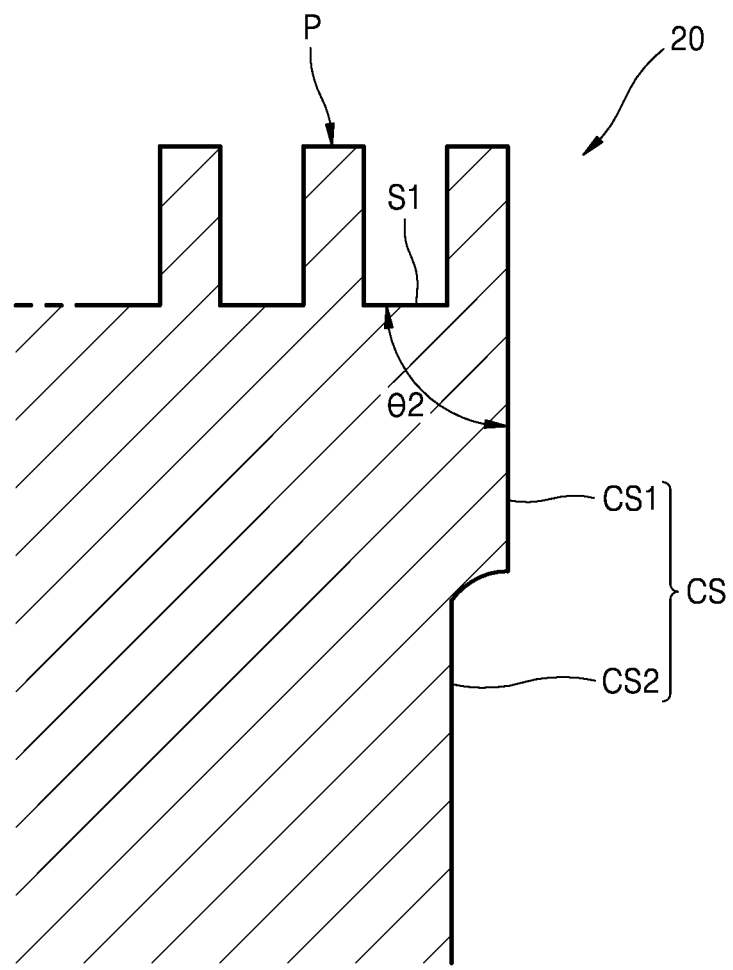

FIGS. 12, 13, and 14 are diagrams for describing a method for manufacturing a unit pattern structure (also referred to herein as a "component pattern structure") 20, according to another exemplary embodiment.

FIG. 12 illustrates that a first surface S1 of a wafer W is processed by using a first blade 11', and FIG. 13 is a magnified view of the first blade 11' of FIG. 12.

Referring to FIGS. 12 and 13, the first surface S1 of the wafer W may be processed by bringing the first blade 11', which rotates by a first rotation shaft 51', into contact with the first surface S1 of the wafer W. The first blade 11' may process the wafer W to a first depth d1 by cutting the first surface S1 of the wafer W in a direction which is perpendicular to the first surface S1.

As illustrated in FIG. 13, the first blade 11' may have a uniform thickness, and first and second cutting faces 11'a and 11'b of the first blade 11' may be perpendicular to the first surface S1. As such, a first trench may be formed in the first surface S1 of the wafer W to the first depth d1. The first trench may include first and second inner wall surfaces which respectively correspond to the first and second cutting faces 11'a and 11'b of the first blade 11', and the first and second inner wall surfaces may be perpendicular to the first surface S1. The first inner wall surface of the first trench may serve as a first cut surface CS1 of the unit pattern structure 20.

Subsequently, a second trench (not shown) may be formed by processing the wafer W from a second surface S2 to a second depth by using a second blade (not shown) that has a thickness which is greater than that of the first blade 11'. The second blade may process the wafer W by cutting the second surface S2 of the wafer W in a direction which is perpendicular to the second surface S2. Like the first blade 11', the second blade may have a uniform thickness, and first and second cutting faces of the second blade may be perpendicular to the second surface S2. The second trench may include first and second inner wall surfaces which respectively correspond to the first and second cutting faces of the second blade, and the first and second inner wall surfaces may be perpendicular to the second surface S2. The first inner wall surface of the second trench may serve as a second cut surface CS2 of the component pattern structure 20.

FIG. 14 is a magnified view of a part near a cut surface CS of the manufactured unit pattern structure 20.

Referring to FIG. 14, the wafer W may be cut by forming the first and second trenches, and thus the unit pattern structure 20 may be manufactured. The cut surface CS of the unit pattern structure 20 may include the first cut surface CS1 defined by the first inner wall surface of the first trench, and the second cut surface CS2 defined by the first inner wall surface of the second trench. The first cut surface CS1 may be perpendicular to the first surface S1 and may protrude outward as compared with the second cut surface CS2. In the unit pattern structure 20, an angle 82 between the first surface S1 and the first cut surface CS1 may be 90°. Since the first cut surface CS1 protrudes outward as compared with the second cut surface CS2 and is perpendicular to the first surface S1, when a large-area pattern structure is manufactured using a tiling technology, seams between adjacent pairs of the unit pattern structures 20 may be minimized.

FIGS. 15 to 22 are diagrams for describing a method for manufacturing a unit pattern structure (also referred to herein as a "component pattern structure") 30, according to another exemplary embodiment.

Figure 15:
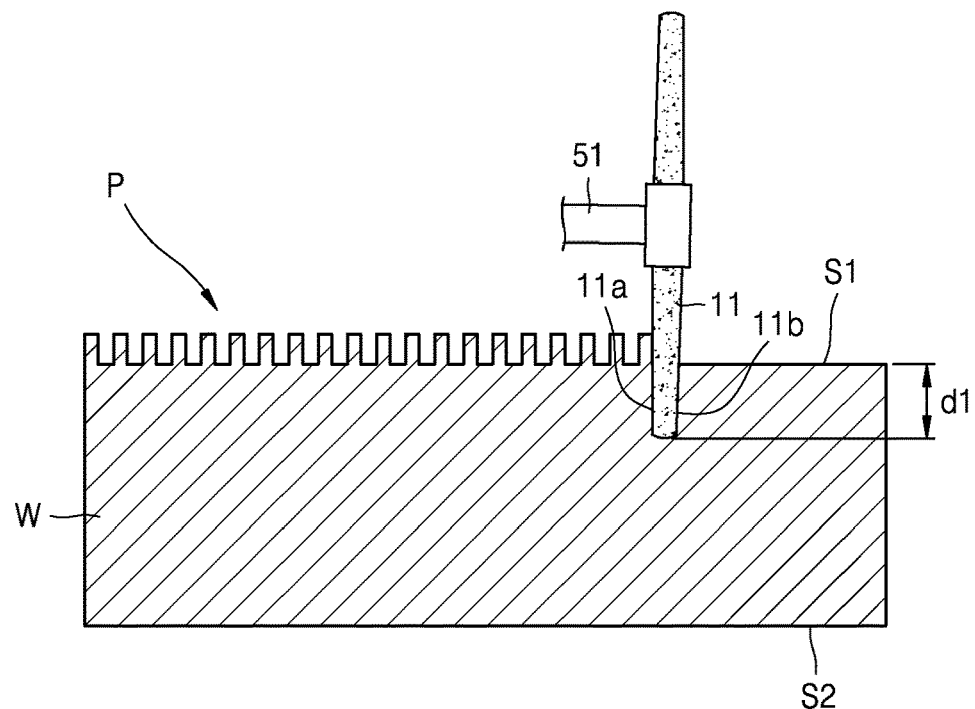
FIGS. 15 to 22 are diagrams for describing a method for manufacturing a unit pattern structure, according to another exemplary embodiment.
Figure 16:
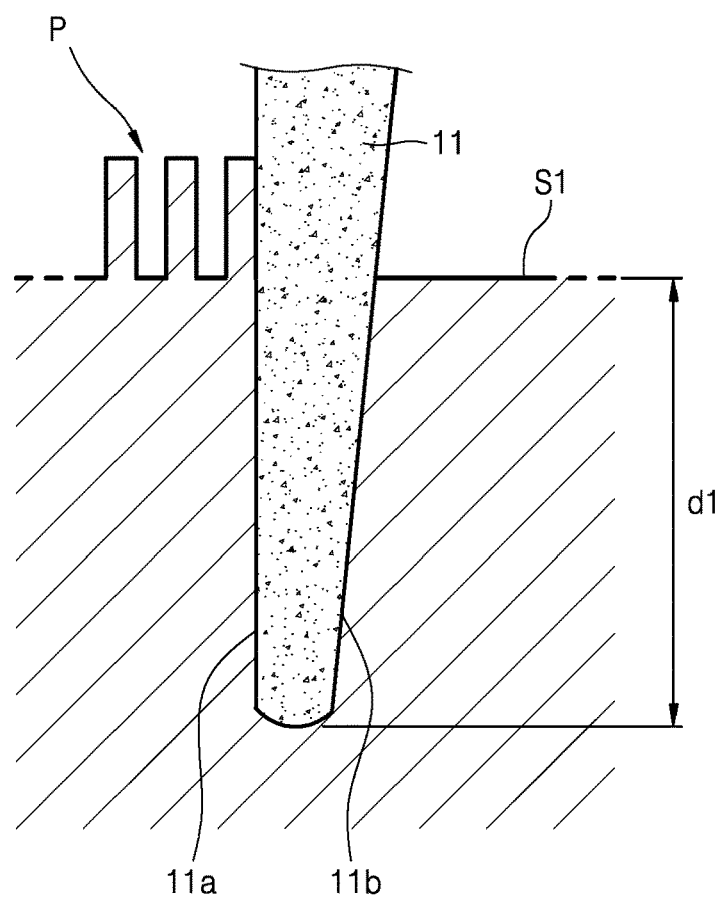

FIG. 15 illustrates that a first surface S1 of a wafer W is processed by using a first blade 11, and FIG. 16 is a magnified view of the first blade 11 of FIG. 15.

Referring to FIGS. 15 and 16, the first surface S1 of the wafer W may be processed to a first depth d1 by bringing the rotating first blade 11 into contact with the first surface S1 of the wafer W.

The first blade 11 may process the wafer W by cutting the first surface S1 of the wafer W slightly diagonally (i.e., at a slight angle) with respect to a direction which is perpendicular to the first surface S1. Herein, an angle of the first blade 11 may be adjusted in such a manner that a first cutting face 11a of the first blade 11 is perpendicular to the first surface S1 as will be described below. In this case, a first rotation shaft 51 may be slightly diagonal (i.e., slightly angled) with respect to the first surface S1 of the wafer W.

As illustrated in FIG. 16, the first blade 11 may have a thickness which is gradually decreasing toward an edge thereof. Since the first blade 11 cuts the first surface S1 slightly diagonally with respect to the direction which is perpendicular to the first surface S1, the first cutting face 11a of the first blade 11 may be perpendicular to the first surface S1, and a second cutting face 11b of the first blade 11 may be diagonal (i.e., angled) with respect to the direction which is perpendicular to the first surface S1.

Figure 17:
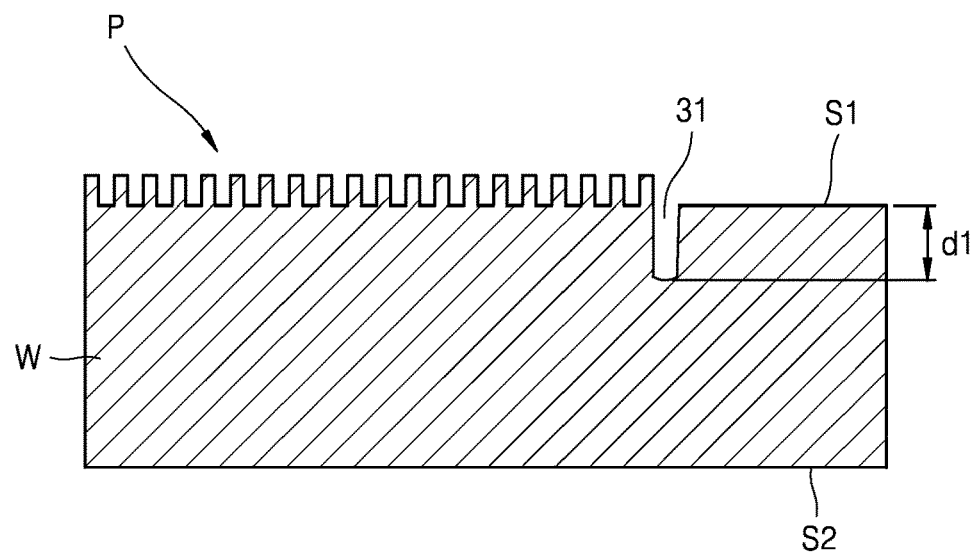
Figure 18:
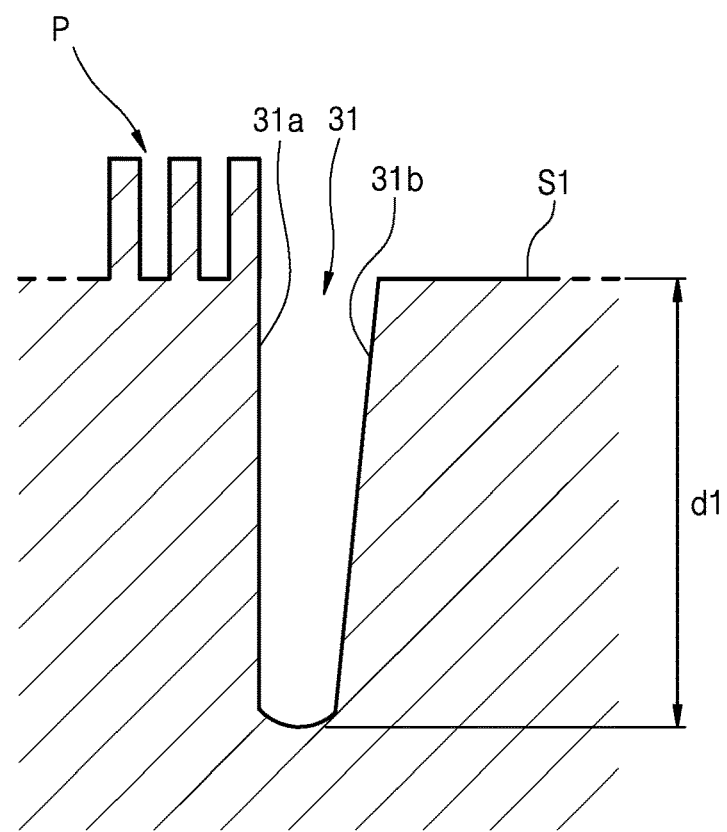

FIG. 17 illustrates that a first trench 31 is formed in the first surface S1 of the wafer W, and FIG. 18 is a magnified view of the first trench 31 of FIG. 17.

Referring to FIGS. 17 and 18, when the first blade 11 moves along a predetermined processing line (not shown) while processing the first surface S1 of the wafer W to the first depth d1, the first trench 31 may be formed to the first depth d1.

The first trench 31 may include first and second inner wall surfaces 31a and 31b which respectively correspond to the first and second cutting faces 11a and 11b of the first blade 11. As such, the first inner wall surface 31a of the first trench 31 may be perpendicular to the first surface S1, and the second inner wall surface 31b of the first trench 31 may be diagonal (i.e., angled) with respect to the direction perpendicular to the first surface S1. The first inner wall surface 31a of the first trench 31 may serve as a first cut surface CS1 of the unit pattern structure 30. Accordingly, the first cut surface CS1 of the unit pattern structure 30 may be perpendicular to the first surface S1.

Figure 19:
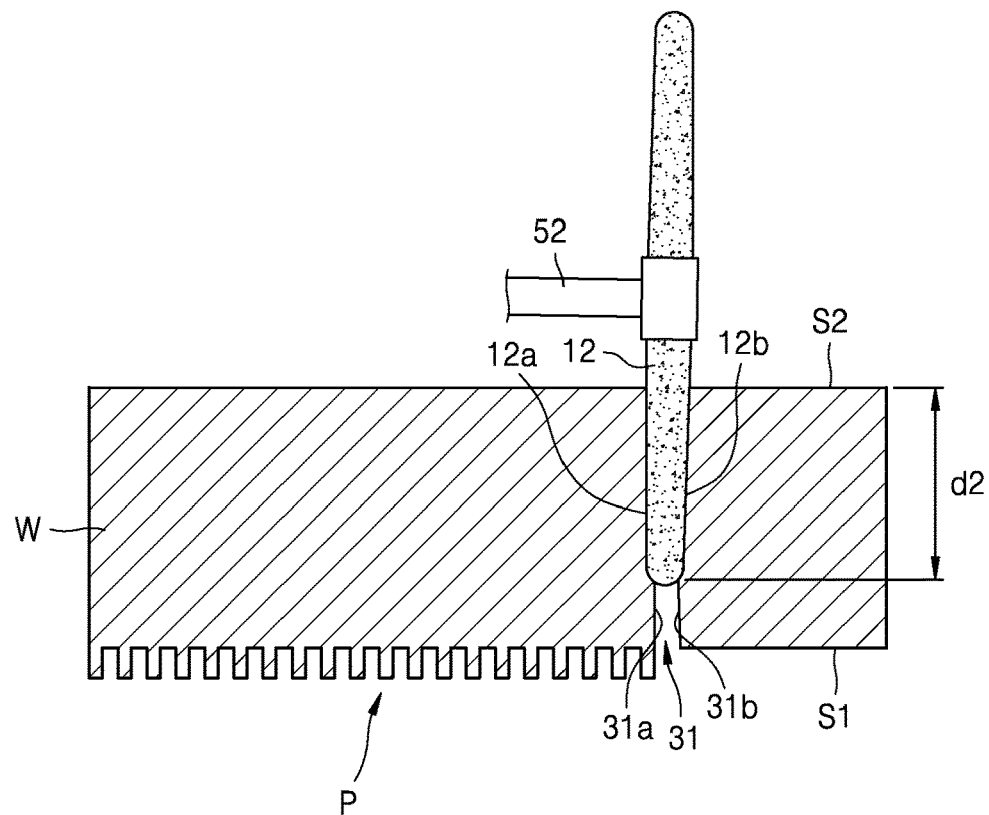

FIG. 19 illustrates that a second surface S2 of the wafer W is processed by using a second blade 12.

Referring to FIG. 19, the second surface S2 of the wafer W may be processed to a second depth d2 by bringing the rotating second blade 12 into contact with the second surface S2 of the wafer W.

The second blade 12 may have a thickness which is greater than that of the first blade 11. The second blade 12 may process the wafer W from the second surface S2 to a depth where the first trench 31 is formed, and the second depth d2 may be greater than the first depth d1.

The second blade 12 may process the wafer W by cutting the second surface S2 of the wafer W slightly diagonally with respect to a direction which is perpendicular to the second surface S2. Herein, an angle of the second blade 12 may be adjusted in such a manner that a first cutting face 12a of the second blade 12 is perpendicular to the second surface S2 as will be described below. In this case, a second rotation shaft 52 may be slightly diagonal with respect to the second surface S2 of the wafer W.

Similarly as the first blade 11, the second blade 12 may have a thickness which is gradually decreasing toward an edge thereof. Since the second blade 12 cuts the second surface S2 of the wafer W slightly diagonally with respect to the direction which is perpendicular to the second surface S2, the first cutting face 12a of the second blade 12 may be perpendicular to the second surface S2, and a second cutting face 12b of the second blade 12 may be diagonal with respect to the direction which is perpendicular to the second surface S2.

Figure 20:
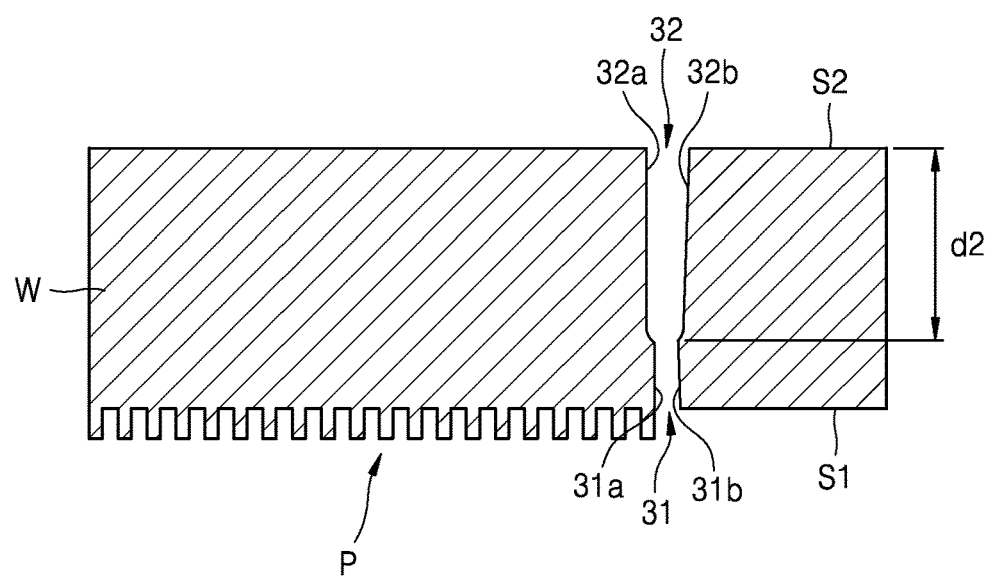

FIG. 20 illustrates that a second trench 32 is formed in the second surface S2 of the wafer W.

Referring to FIG. 20, the second trench 32 may be formed from the second surface S2 to the second depth d2 and connected to the first trench 31.

The second trench 32 may include first and second inner wall surfaces 32a and 32b which respectively correspond to the first and second cutting faces 12a and 12b of the second blade 12. As such, the first inner wall surface 32a of the second trench 32 may be perpendicular to the second surface S2, and the second inner wall surface 32b of the second trench 32 may be diagonal with respect to the direction which is perpendicular to the second surface S2. The first inner wall surface 32a of the second trench 32 may serve as a second cut surface CS2 of the unit pattern structure 30. Accordingly, the second cut surface CS2 of the unit pattern structure 30 may be perpendicular to the second surface S2.

Figure 21:
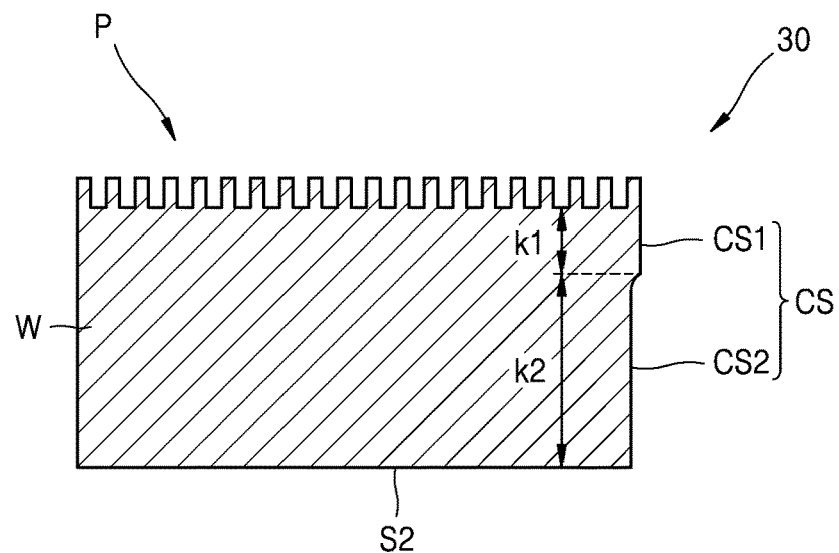
Figure 22:
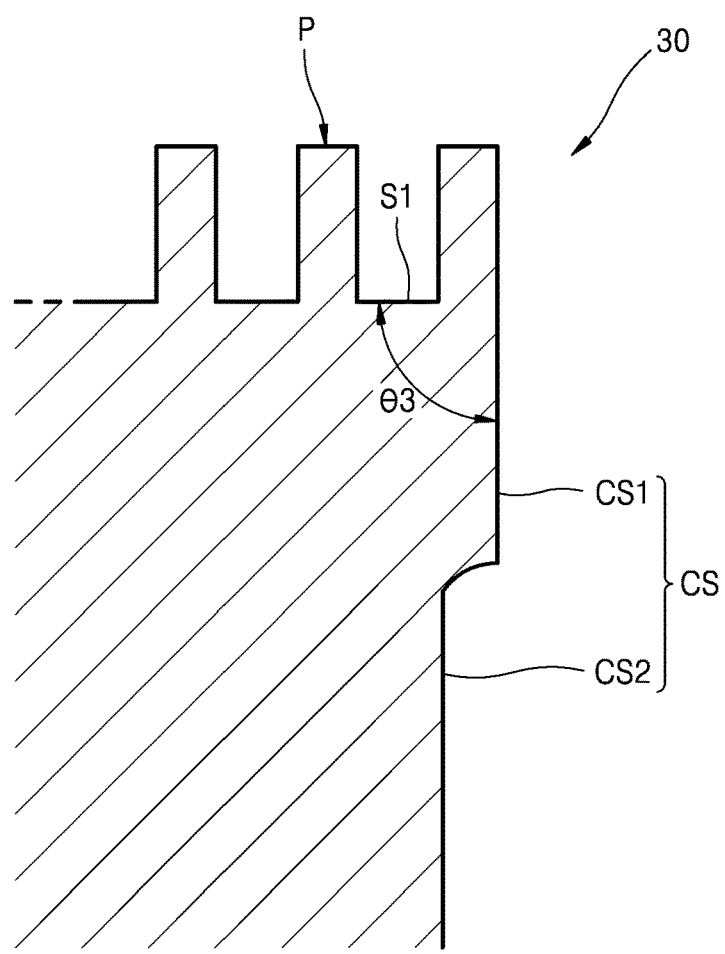

FIG. 21 is a cross-sectional view of the manufactured unit pattern structure 30, and FIG. 22 is a magnified view of a part near a cut surface CS of the unit pattern structure 30 illustrated in FIG. 21.

Referring to FIGS. 21 and 22, the cut surface CS of the unit pattern structure 30 may include the first and second cut surfaces CS1 and CS2. The first cut surface CS1 may be defined by the first inner wall surface 31a of the first trench 31, and the second cut surface CS2 may be defined by the first inner wall surface 32a of the second trench 32.

A thickness k1 of the first cut surface CS1 formed by the first trench 31 may be less than a thickness k2 of the second cut surface CS2 formed by the second trench 32. The first cut surface CS1 may protrude outward as compared with the second cut surface CS2.

In the unit pattern structure 30, an angle 83 between the first surface S1 and the first cut surface CS1 may be 90°. As described above, since the first cut surface CS1 defined by the first inner wall surface 31a of the first trench 31 has a shape that corresponds to the first cutting face 11a of the first blade 11, the first cut surface CS1 may be perpendicular to the first surface S1. Since the second cut surface CS2 defined by the first inner wall surface 32a of the second trench 32 has a shape that corresponds to the first cutting face 12a of the second blade 12, the second cut surface CS2 may be perpendicular to the second surface S2. A pattern structure may be manufactured by manufacturing the above-described unit pattern structure 30 in a plural number, and then bonding the unit pattern structures 30 together by using a tiling technology.

Figure 23:
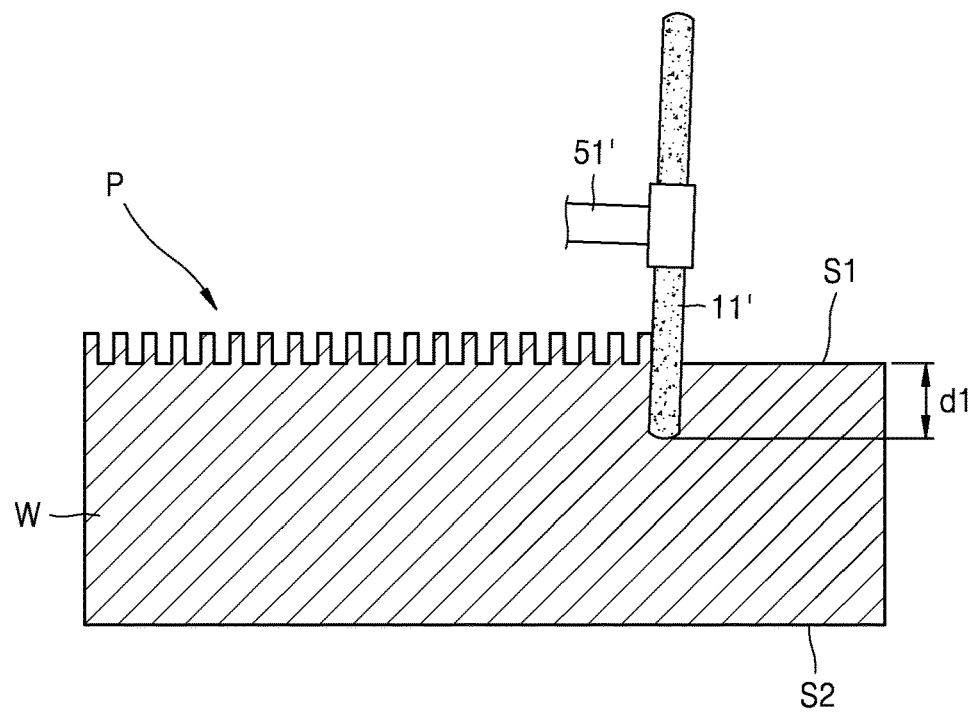
FIGS. 23 to 25 are diagrams for describing a method for manufacturing a unit pattern structure, according to another exemplary embodiment.
Figure 24:
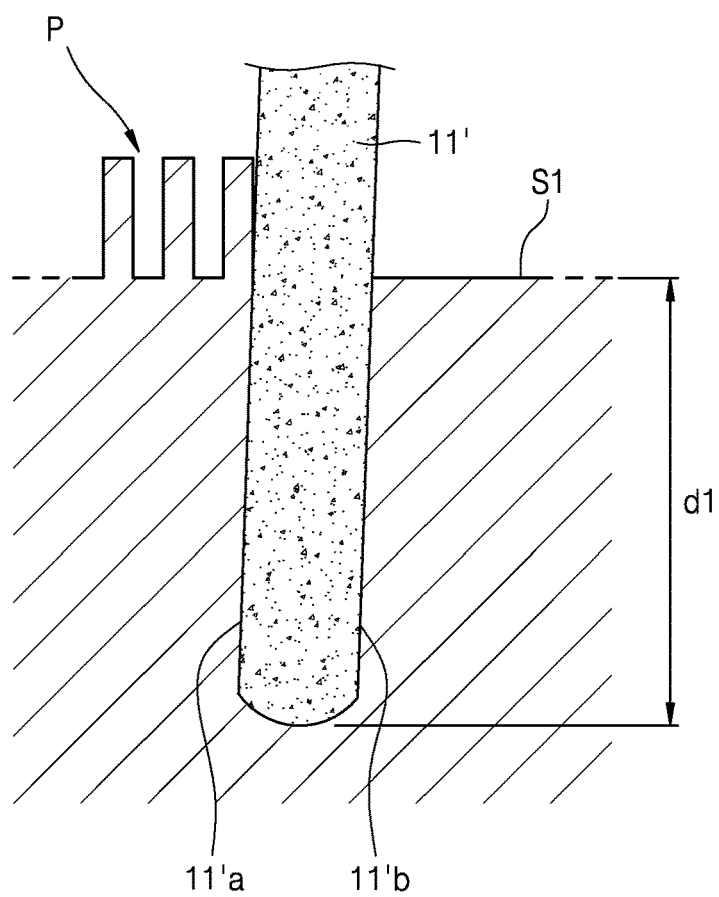
Figure 25:
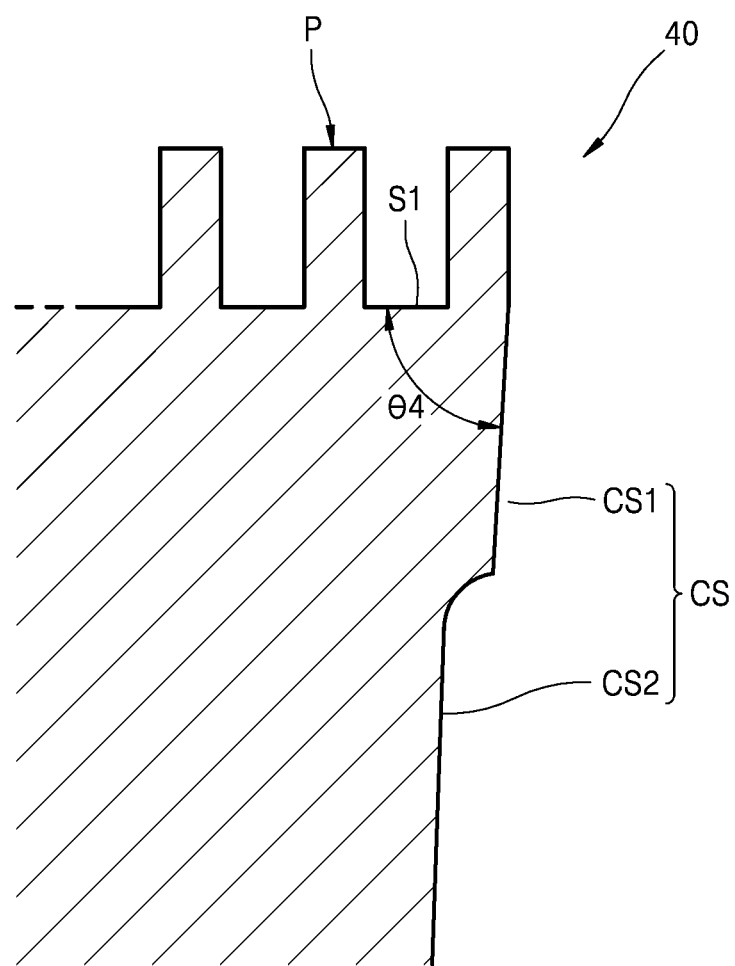

FIGS. 23, 24, and 25 are diagrams for describing a method of manufacturing a unit pattern structure (also referred to herein as a "component pattern structure") 40, according to another exemplary embodiment.

FIG. 23 illustrates that a first surface S1 of a wafer W is processed by using a first blade 11', and FIG. 24 is a magnified view of the first blade 11' of FIG. 23.

Referring to FIGS. 23 and 24, the first surface S1 of the wafer W may be processed to a first depth d1 by bringing the first blade 11' into contact with the first surface S1 of the wafer W. The first blade 11' may process the wafer W by cutting the first surface S1 of the wafer W slightly diagonally (i.e., at a slight angle) with respect to a direction which is perpendicular to the first surface S1. The first blade 11' may have a uniform thickness, and first and second cutting faces 11'a and 11'b of the first blade 11' may be slightly diagonal with respect to the direction which is perpendicular to the first surface S1. Due to the above-described first blade 11', a first trench may be formed in the first surface S1 of the wafer W to the first depth d1. First and second inner wall surfaces of the first trench may be diagonal with respect to the direction which is perpendicular to the first surface S1, and the first inner wall surface of the first trench may serve as a first cut surface CS1 of the unit pattern structure 40.

Subsequently, a second trench (not shown) may be formed by processing the wafer W from a second surface S2 to a second depth by using a second blade (not shown) that has a thickness which is greater than that of the first blade 11'. Herein, the second blade may process the second surface S2 of the wafer W by cutting the second surface S2 of the wafer W slightly diagonally (i.e., at a slight angle) with respect to a direction which is perpendicular to the second surface S2.

The second blade may also have a uniform thickness, and first and second cutting faces of the second blade may be slightly diagonal with respect to the direction which is perpendicular to the second surface S2. Due to the above-described second blade, the second trench may be formed to the second depth in the second surface S2 of the wafer W. The first and second inner wall surfaces of the second trench may be diagonal with respect to the direction which is perpendicular to the second surface S2, and the first inner wall surface of the second trench may serve as a second cut surface CS2 of the unit pattern structure 40.

FIG. 25 is a magnified view of a part near a cut surface CS of the manufactured unit pattern structure 40.

Referring to FIG. 25, the cut surface CS of the unit pattern structure 40 may include the first and second cut surfaces CS1 and CS2, and the first cut surface CS1 may protrude outward as compared with the second cut surface CS2. The first cut surface CS1 may be slightly diagonal with respect to the direction which is perpendicular to the first surface S1. That is, an angle 84 between the first surface S1 and the first cut surface CS1 may be less than 90°. The second cut surface CS2 may be slightly diagonal with respect to the direction perpendicular to the second surface S2.

FIGS. 26 to 33 are diagrams for describing a method for manufacturing a pattern structure 100, according to an exemplary embodiment. For the sake of convenience, the following description will be given of a method for manufacturing the pattern structure 100 by bonding two unit pattern structures, e.g., first and second unit pattern structures 111 and 112, to each other.

Figure 26:
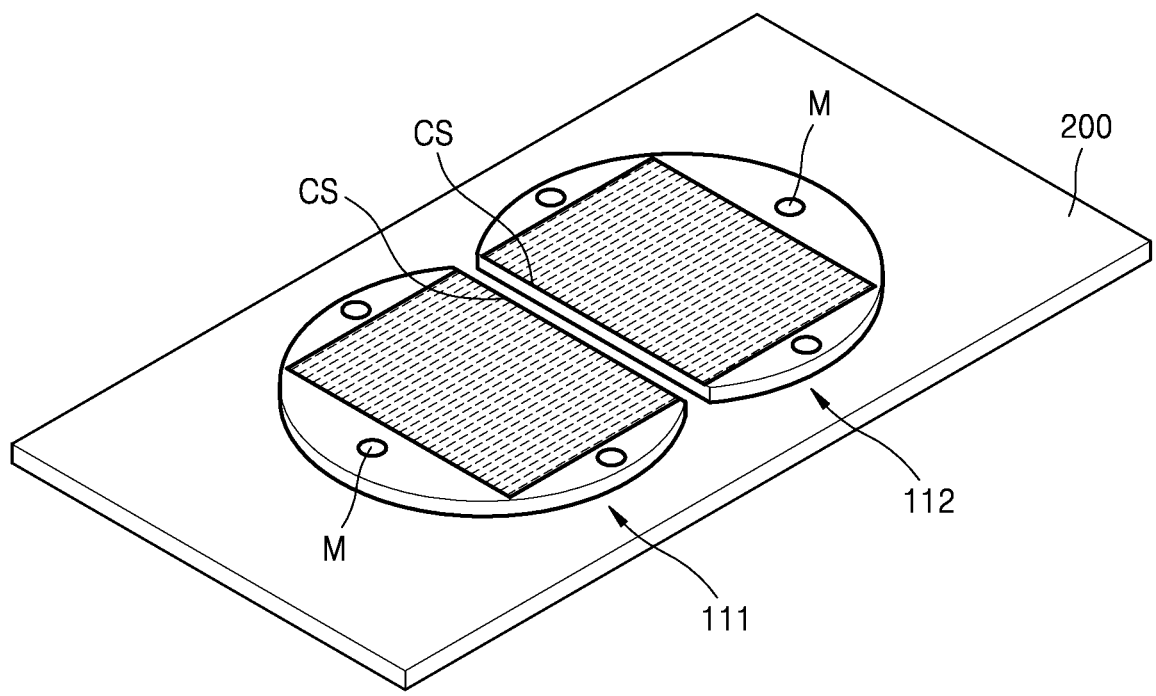
FIGS. 26 to 33 are diagrams for describing a method for manufacturing a pattern structure, according to an exemplary embodiment.
Figure 27:
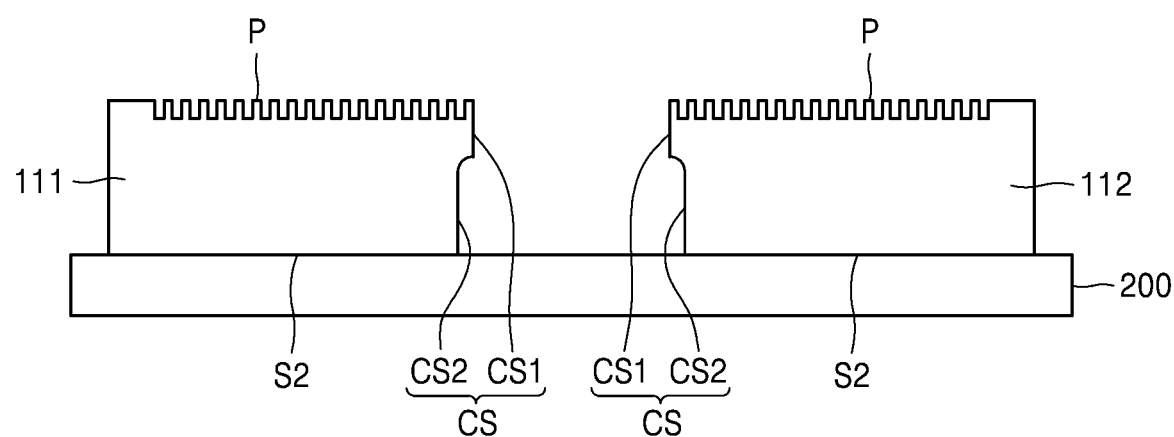

FIG. 26 is a perspective view of the first and second unit pattern structures 111 and 112 provided on a substrate 200, and FIG. 27 is a cross-sectional view of FIG. 26.

Referring to FIGS. 26 and 27, the first and second unit pattern structures 111 and 112 are provided on the flat substrate 200. Herein, each of the first and second unit pattern structures 111 and 112 may be equivalent to any one of the unit pattern structures 10, 20, 30, and 40 described above according to the previous exemplary embodiments. Each of the first and second unit pattern structures 111 and 112 may include a cut surface CS which includes first and second cut surfaces CS1 and CS2. Herein, the first cut surface CS1 may protrude outward as compared with the second cut surface CS2. The first cut surface CS1 may have a thickness which is less than the thickness of the second cut surface CS2.

The first and second unit pattern structures 111 and 112 may be provided on the substrate 200 in such a manner that fine patterns P formed in each of the first surfaces of the first and second unit pattern structures 111 and 112 face upward and second surfaces S2 of the first and second unit pattern structures 111 and 112 face the substrate 200. For example, a glass substrate may be used as the substrate 200. However, the substrate 200 is not limited thereto, and a plastic substrate may also be used, provided that the plastic substrate has a flat and smooth surface.

Figure 28:
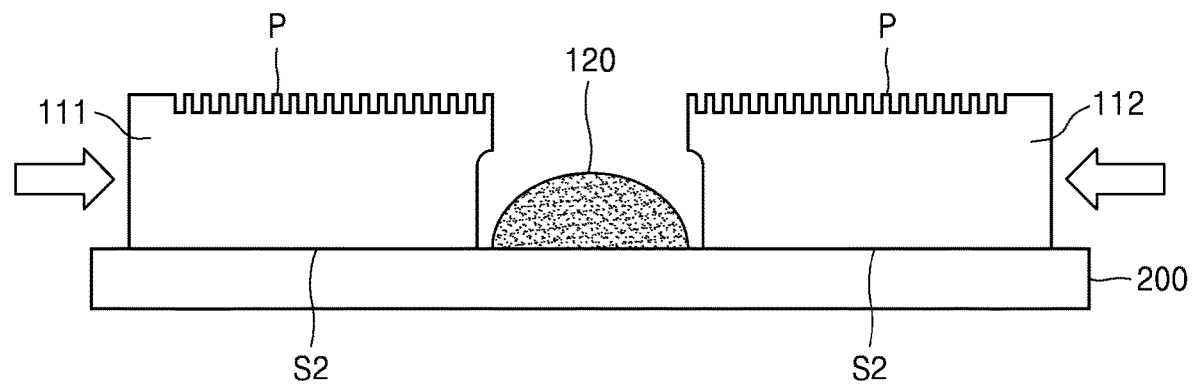

FIG. 28 illustrates that a liquid resin 120 is prepared between the first and second unit pattern structures 111 and 112, and then the first and second unit pattern structures 111 and 112 are put closer to each other.

Referring to FIG. 28, a liquid photocurable resin or a thermosetting resin 120 may be provided in an empty space between the first and second unit pattern structures 111 and 112. The resin 120 may include, for example, an acrylate-based material. Instead of a photocurable or thermosetting resin, a photocompressible or thermocompressible resin may be used as the resin 120. In this case, for example, the resin 120 may include a polyurethane-based material.

Subsequently, the first and second unit pattern structures 111 and 112 are aligned so as to position the cut surfaces CS thereof closer to each other, i.e., within a predetermined proximity with respect to each other. In this case, the fine patterns P of the first and second unit pattern structures 111 and 112 may match each other by using alignment marks M (see FIG. 26). In this process, the first and second unit pattern structures 111 and 112 may be more precisely aligned by using positioners 117 as illustrated in FIG. 29.

Figure 29:
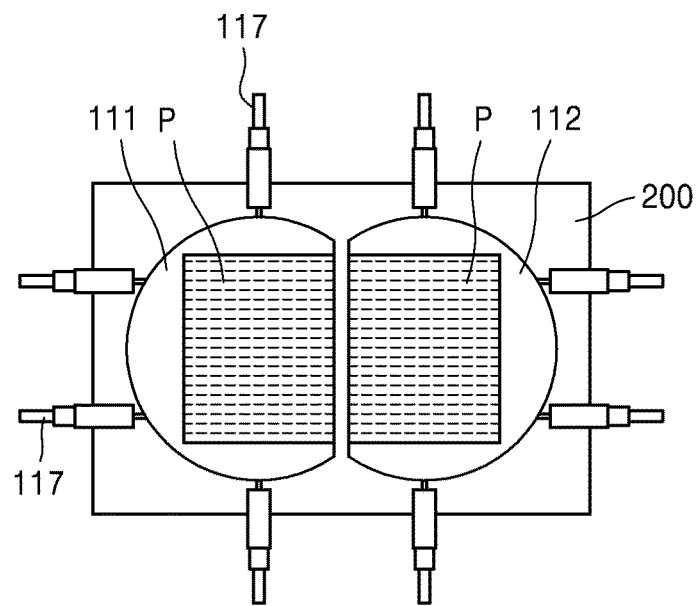

Referring to FIG. 29, respective locations of the first and second unit pattern structures 111 and 112 may be adjusted by the positioners 117. Accordingly, when the first and second unit pattern structures 111 and 112 are aligned and positioned closer to each other, the first and second unit pattern structures 111 and 112 may be moved to desired locations by using the positioners 117. If relative locations between the first and second unit pattern structures 111 and 112 moved by the positioners 117 are monitored by using a camera (not shown) in real time, the first and second unit pattern structures 111 and 112 may be more precisely aligned.

Figure 30:
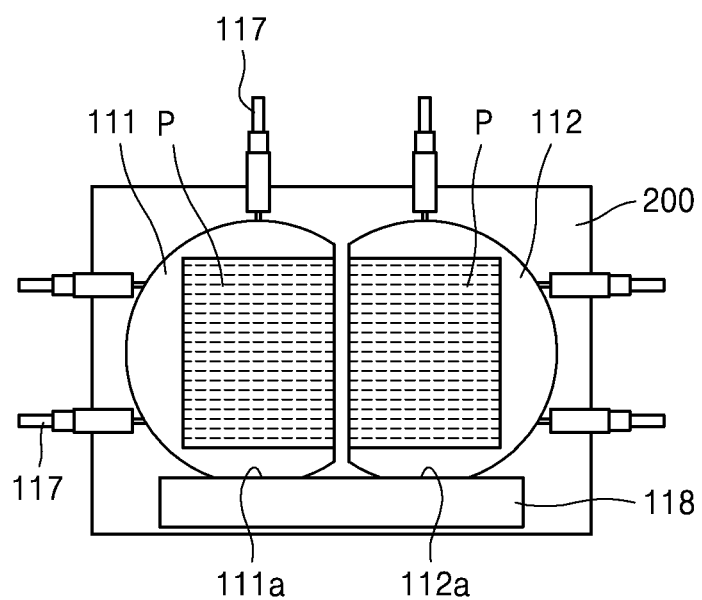

FIG. 30 illustrates a modified example of the method for aligning the first and second unit pattern structures 111 and 112. Referring to FIG. 30, flat zones 111a and 112a may be provided on the first and second unit pattern structures 111 and 112, respectively. A flat plate 118 may be provided on the substrate 200. Since the flat plate 118 guides the flat zones 111a and 112a of the first and second unit pattern structures 111 and 112 when the positioners 117 adjust the locations of the first and second unit pattern structures 111 and 112, the first and second unit pattern structures 111 and 112 may be more precisely aligned.

Figure 31:
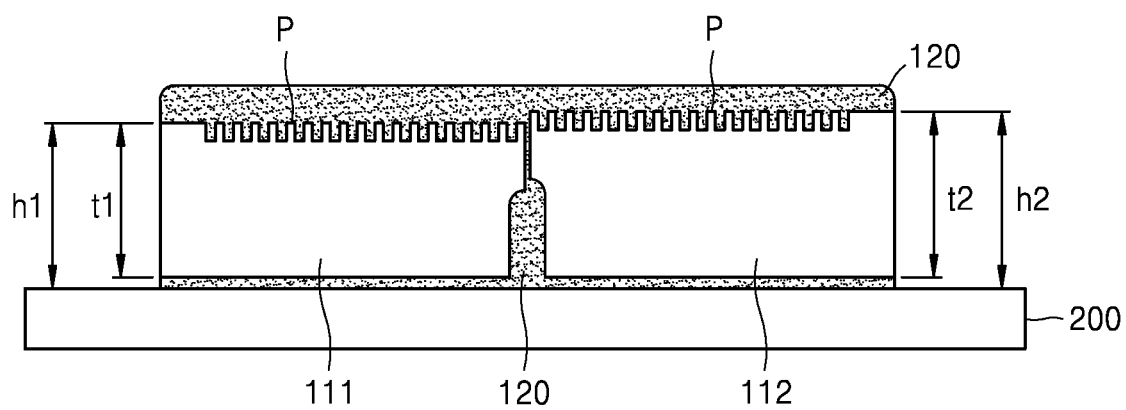

FIG. 31 illustrates that the first and second unit pattern structures 111 and 112 are aligned.

Referring to FIG. 31, when the first and second unit pattern structures 111 and 112 are aligned and placed closer to each other by using the above-described method, the resin 120 between the first and second unit pattern structures 111 and 112 may be dispersed between the cut surfaces CS of the first and second unit pattern structures 111 and 112, between the substrate 200 and the second surfaces S2 of the first and second unit pattern structures 111 and 112, and on the fine patterns P of the first and second unit pattern structures 111 and 112. Herein, the resin 120 may have a viscosity which is less than, for example, about 1000 cps, such that the resin 120 is easily dispersed.

As illustrated in FIG. 31, the first and second unit pattern structures 111 and 112, which are manufactured by using wafers that have a thickness difference, may have different thicknesses. For example, the first unit pattern structure 111, illustrated at a left side of FIG. 31, may have a thickness t1, and the second unit pattern structure 112, illustrated at a right side of FIG. 31, may have a thickness t2. Then, the fine patterns P of the first unit pattern structure 111 at the left side may be located at a height h1 with respect to the substrate 200, and the fine patterns P of the second unit pattern structure 112 at the right side may be located at a height h2 with respect to the substrate 200.

Figure 32:
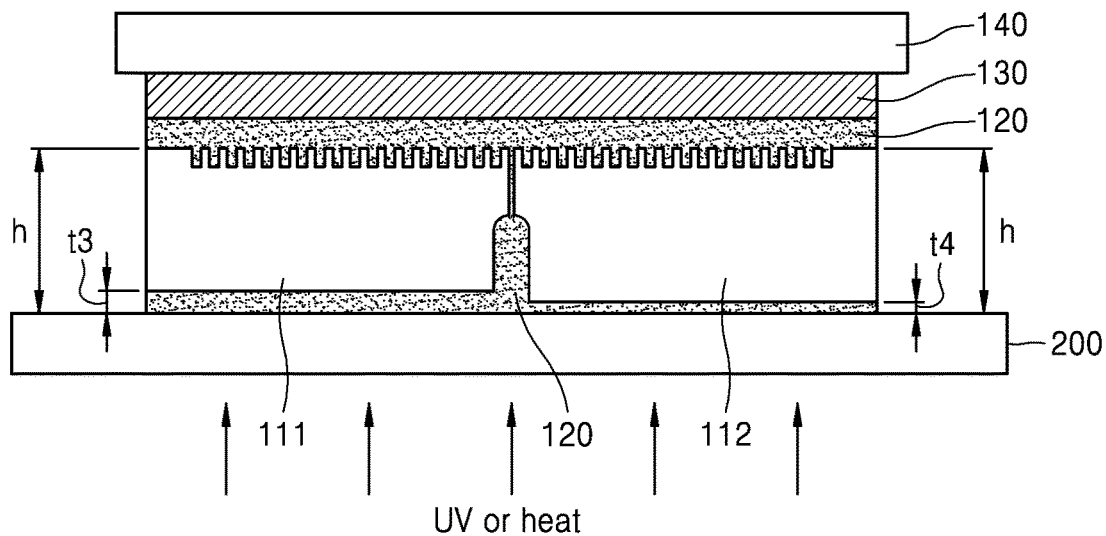

FIG. 32 illustrates that a base layer 130 is provided on the first and second unit pattern structures 111 and 112.

Referring to FIG. 32, the base layer 130 is provided on the resin 120 that is dispersed on the fine patterns P of the first and second unit pattern structures 111 and 112. The base layer 130 is configured to support a stamp and may be made of, for example, a plastic such as polyethylene terephthalate (PET). The base layer 130 may be provided in such a manner that a flat surface thereof is in contact with the resin 120.

Thereafter, a pressing layer 140 is provided on the base layer 130 and configured to press the base layer 130. Although the wide and flat pressing layer 140 is used in FIG. 32, the current exemplary embodiment is not limited thereto and, for example, a cylindrical pressing roller (not shown) may be rolled on the base layer 130 to press the base layer 130 toward the substrate 200.

When the base layer 130 is pressed toward the first and second unit pattern structures 111 and 112, the resin 120 dispersed between the base layer 130 and the first and second unit pattern structures 111 and 112 may serve as a buffer material which is capable of preventing damage to the fine patterns P. The resin 120 dispersed between the substrate 200 and the first and second unit pattern structures 111 and 112 may serve as a compensation layer which is capable of equalizing the heights of the fine patterns P of the first and second unit pattern structures 111 and 112. For example, when the pressing layer 140 presses the base layer 130, the thickness of the resin 120 dispersed between the substrate 200 and the first and second unit pattern structures 111 and 112 may be modified in such a manner that equal pressures are applied between the base layer 130 and the first unit pattern structure 111 and between the base layer 130 and the second unit pattern structure 112. As such, the fine patterns P of the first and second unit pattern structures 111 and 112 may be aligned to the same height h, and the thickness of the resin 120 under the second surfaces S2 may be partially changed. For example, a part of the resin 120 under the first unit pattern structure 111 at the left side may have a thickness t3, and another part of the resin 120 under the second unit pattern structure 112 at the right side may have a thickness t4.

Subsequently, after vertical locations of the fine patterns P of the first and second unit pattern structures 111 and 112 are equalized, heat or light (e.g., ultraviolet (UV) light) is applied to the resin 120. Although heat or light is applied to the resin 120 from below the substrate 200 in FIG. 32, the direction of applying heat or light is not particularly limited. For example, when the base layer 130 is made of a material that is transparent with respect to visible light or UV light, the pressing layer 140 may be removed and heat or light may be applied to the resin 120 from above the base layer 130. Alternatively, heat or light may be applied from sides of the first and second unit pattern structures 111 and 112. Then, the resin 120 may be hardened due to a cross link reaction, thereby bonding the first and second unit pattern structures 111 and 112 to each other. When the resin 120 is a photo-compressible resin or a thermocompressible resin, a solvent in the resin 120 may evaporate in order to compress the resin 120, thereby bonding the first and second unit pattern structures 111 and 112 to each other. Herein, a seam between the first and second unit pattern structures 111 and 112, i.e., a gap between the cut surfaces CS, may have a very small width equal to or less than 10 μm.

Figure 33:
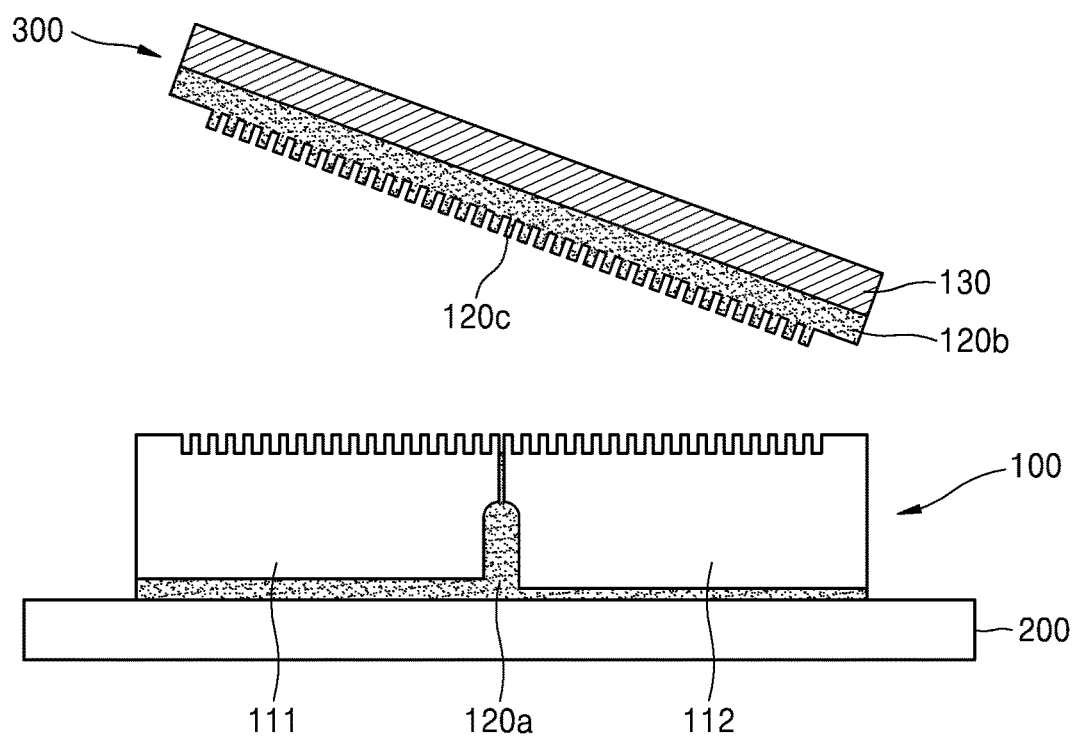

FIG. 33 illustrates that the base layer 130 is detached from the first and second unit pattern structures 111 and 112.

Referring to FIG. 33, after the resin 120 is hardened as described above, the base layer 130 is detached. In this case, a part 120b of the resin 120 dispersed on the fine patterns P of the first and second unit pattern structures 111 and 112 is detached together with the base layer 130. A part 120a of the resin 120 dispersed between the cut surfaces CS of the first and second unit pattern structures 111 and 112 and between the substrate 200 and the second surfaces S2 of the first and second unit pattern structures 111 and 112 remains in the pattern structure 100 that is manufactured by bonding the first and second unit pattern structures 111 and 112 to each other. In particular, a part 120c of the resin 120 that has a small thickness and is caught between the fine patterns P on the gap between the cut surfaces CS of the first and second unit pattern structures 111 and 112 may be detached together with the base layer 130. The resin part 120b adhered on the base layer 130 has patterns that are complementary to the fine patterns P. Accordingly, the base layer 130 and the resin part 120b detached as described above in relation to FIG. 33 may serve as a stamp 300 which is configured for imprinting fine patterns by using an imprinting technology.

The pattern structure 100 manufactured by using the above-described method may serve as a master mold for reproducing the stamp 300. For example, similarly to the above-described method, an additional stamp 300 may be reproduced by additionally dispersing a stamp reproduction resin on the fine patterns P of the pattern structure 100, providing and pressing the base layer 130 on the stamp reproduction resin, hardening the stamp reproduction resin, and then detaching the base layer 130. In this aspect, one stamp 300 may be produced when the pattern structure 100 serving as a master mold is manufactured, and then the stamp 300 may be additionally reproduced by performing the subsequent process. As described above, since the resin 120 completely fills the gap between the cut surfaces CS of the first and second unit pattern structures 111 and 112, the stamp reproduction resin may be prevented from going into the gap between the cut surfaces CS of the first and second unit pattern structures 111 and 112 in the subsequent stamp reproduction process.

Meanwhile, the resin part 120c that has a small thickness and is caught between the fine patterns P on the gap between the cut surfaces CS of the first and second unit pattern structures 111 and 112 may serve as a defect of the stamp 300 so as to show the seam. However, since the gap between the cut surfaces CS of the first and second unit pattern structures 111 and 112 may have a very small width that is equal to or less than 10 μm, the resin part 120c at the seam may be sufficiently covered by a black matrix of a display panel. Therefore, when fine patterns are imprinted by using the pattern structure 100 and the stamp 300 manufactured according to the current exemplary embodiment, since a seam thereof is covered by a black matrix of a display panel and thus is not seen, no defect may be visible on the display panel.

Figure 34:
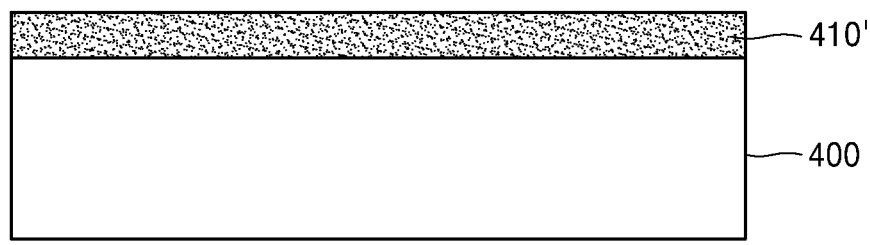
FIGS. 34 and 35 are cross-sectional views for describing a method for forming a large-area grid layer on a surface of a backlight unit.
Figure 35:
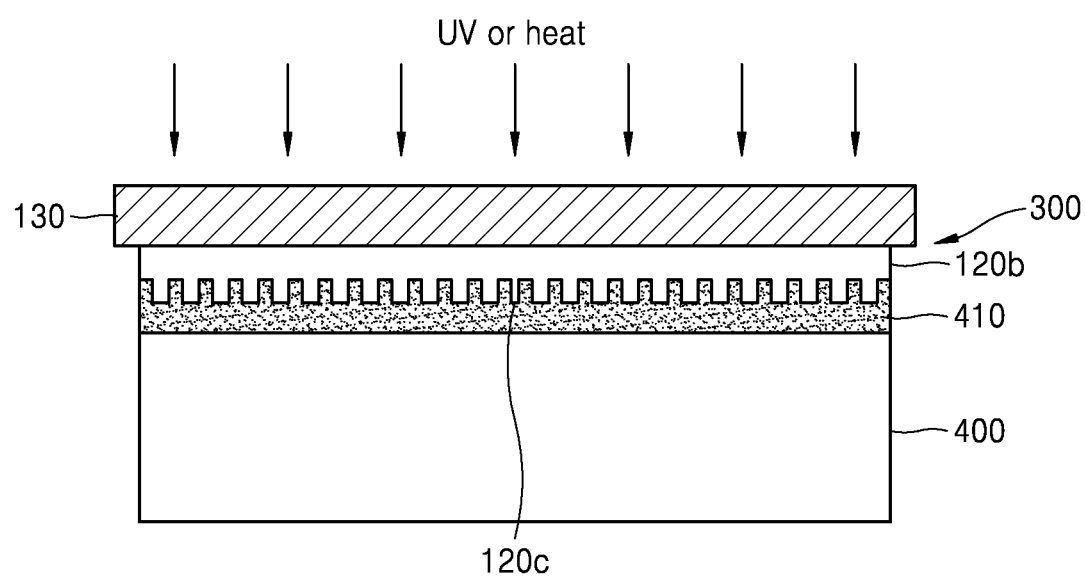

FIGS. 34 and 35 are cross-sectional views for describing a method for forming a large-area grid layer 410 on a surface of a backlight unit 400 by using the above-described stamp 300.

Referring to FIG. 34, a resin layer 410' is formed on the surface of the backlight unit 400. The surface of the backlight unit 400 may be a light exiting surface from which light is emitted. For example, when the backlight unit 400 is a direct type backlight unit, the resin layer 410' may be formed on a light diffuser plate of the backlight unit 400. Alternatively, when the backlight unit 400 is an edge type backlight unit, the resin layer 410' may be formed on a light exiting surface of a light guide plate. The resin layer 410' may include, for example, a photocurable resin, a thermosetting resin, a photocompressible resin, or a thermocompressible resin.

Referring to FIG. 35, the stamp 300 presses the resin layer 410' from above. The stamp 300 may be one that is manufactured as described above in relation to FIG. 33, or one that is additionally manufactured by using the pattern structure 100 as a master mold. In this case, the stamp 300 may be provided in such a manner that the resin part 120*b* that has complementary patterns faces the resin layer 410'. Then, the resin layer 410' that has fluidity is filled in the complementary patterns of the resin part 120*b*. In this state, light (e.g., UV light) or heat may be applied to the resin layer 410', and thus the grid layer 410 may be formed on the surface of the backlight unit 400. The grid layer 410 formed as described above may have patterns that are identical to the fine patterns P of the pattern structure 100.

Figure 36:
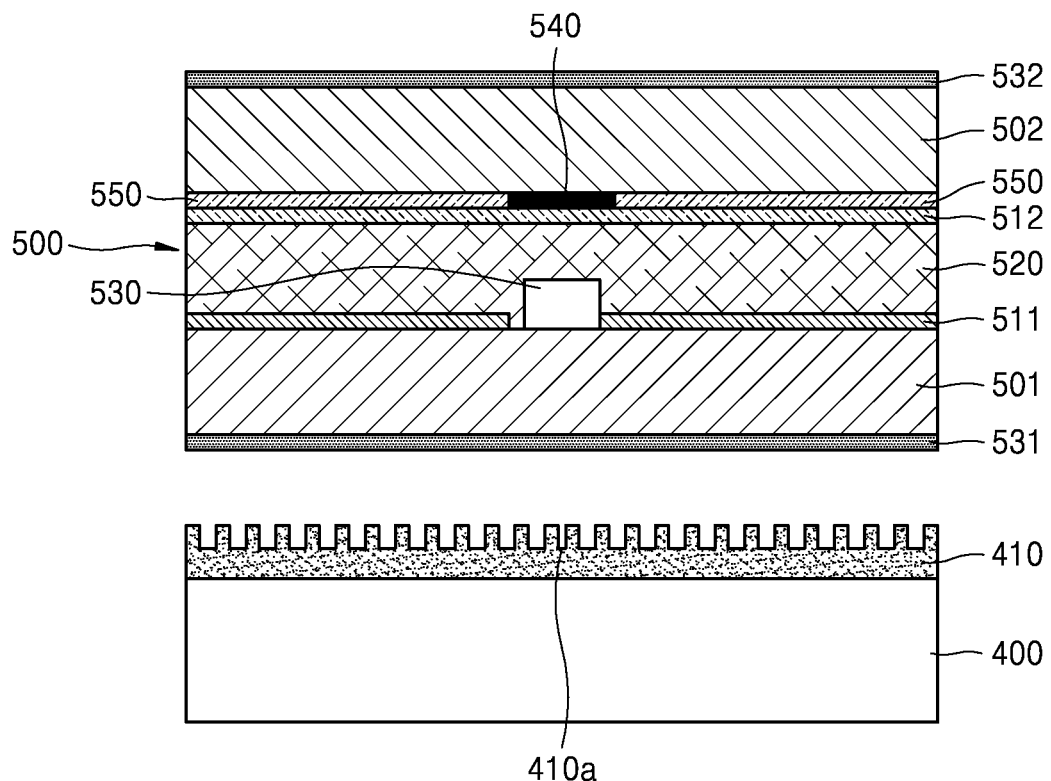
FIG. 36 is a cross-sectional view of a liquid crystal display (LCD) apparatus including the backlight unit manufactured using the method illustrated in FIGS. 34 and 35.

FIG. 36 is a cross-sectional view of a liquid crystal display (LCD) apparatus 500 that includes the backlight unit 400 which is manufactured by using the method illustrated in FIGS. 34 and 35.

Referring to FIG. 36, the LCD apparatus 500 may include a first substrate 501 and a second substrate 502 which are spaced apart from each other, a liquid crystal layer 520 disposed between the first and second substrates 501 and 502, and the backlight unit 400 configured to emit light toward the liquid crystal layer 520. A plurality of first electrodes 511 and a plurality of thin film transistors 530 connected to the first electrodes 511 to control operation of the liquid crystal layer 520 are provided on the first substrate 501. The first electrodes 511 may be pixel electrodes provided in individual pixels of the LCD apparatus 500.

A second electrode 512 serving as a common electrode is provided below the second substrate 502. A plurality of color filters 550 are provided between the second substrate 502 and the second electrode 512 to correspond to the first electrodes 511. Herein, each of the color filters 550 may be configured to transmit light of a predetermined color (e.g., red, green, or blue). A black matrix 540 is formed between the color filters 550. The black matrix 540 may block light in order to prevent crosstalk and increase contrast between pixels.

A first polarizer 531 and a second polarizer 532 may be provided on outer surfaces of the first and second substrates 501 and 502, respectively. Absorptive polarizers, e.g., polyvinyl alcohol (PVA) polarizers, may be used as the first and second polarizers 531 and 532, but the first and second polarizers 531 and 532 are not limited thereto. In the LCD apparatus 500 having the above-described structure, since the grid layer 410 provided on the backlight unit 400 controls light to propagate in a certain direction per pixel, a three-dimensional (3D) image may be realized in a glassless manner.

As illustrated in FIG. 36, the grid layer 410 transferred on the surface of the backlight unit 400 may have a part 410*a* that corresponds to a seam of the pattern structure 100. In the LCD apparatus 500 according to the current exemplary embodiment, the seam part 410*a* of the grid layer 410 may be provided at a location that corresponds to the black matrix 540. In particular, the seam part 410*a* of the grid layer 410 is located directly under the black matrix 540. As described above, the seam part 410*a* of the grid layer 410 may have a width (e.g., equal to or less than 10 μm) which is less than the width of the black matrix 540. When the seam part 410*a* that has a width which is less than the width of the black matrix 540 is located under the black matrix 540, since the seam part 410*a* is covered by the black matrix 540 and thus is not visible, an image that has no defects may be displayed in a large area.

A large-area metal wire grid polarizer may be formed by using the above-described pattern structure 100 and the stamp 300.

FIGS. 37 to 42 are cross-sectional views for describing a method for manufacturing a large-area metal wire grid polarizer 600 by using the above-described stamp 300.

Figure 37:
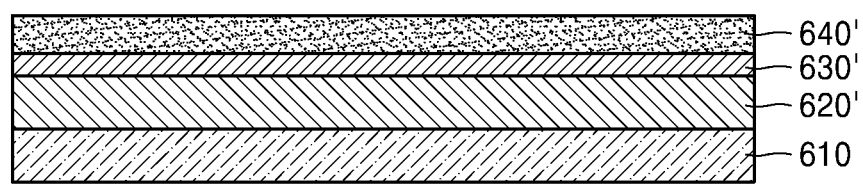
FIGS. 37 to 42 are cross-sectional views for describing a method for manufacturing a large-area metal wire grid polarizer.

Referring to FIG. 37, a metal layer 620', a hard mask 630', and a resin layer 640' are sequentially stacked on a supporting substrate 610. For example, a transparent glass substrate or a transparent polymer substrate that is capable of transmitting visible light may be used as the supporting substrate 610. The metal layer 620' may include a conductive metal such as gold (Au), silver (Ag), copper (Cu), or aluminum (Al), but is not limited thereto. The hard mask 630' may include a hard material, and the resin layer 640' may include a photocurable material or a thermosetting material that has fluidity.

Figure 38:
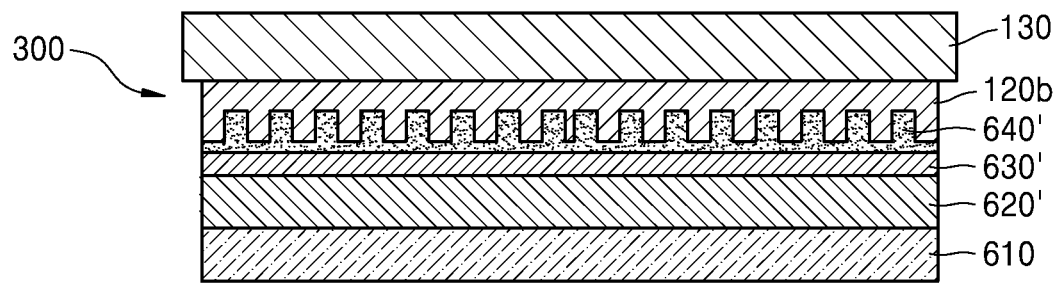

Referring to FIG. 38, the stamp 300 presses the resin layer 640' from above. The stamp 300 may be one that is manufactured as described above in relation to FIG. 33, or one that is additionally manufactured by using the pattern structure 100 as a master mold. In this case, the stamp 300 may be provided in such a manner that the resin part 120*b* that has complementary patterns faces the resin layer 640'. Then, the resin layer 640' that has fluidity is filled in the complementary patterns of the resin part 120*b*. In this state, light (e.g., UV light) or heat is applied to the resin layer 640', and thus the resin layer 640' becomes hardened. Thereafter, the stamp 300 is detached and thus a patterned resin layer 640 is formed on the hard mask 630'.

Figure 39:
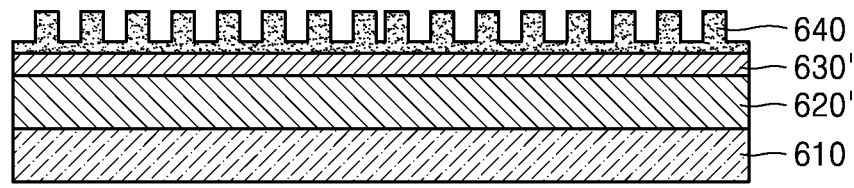
Figure 40:
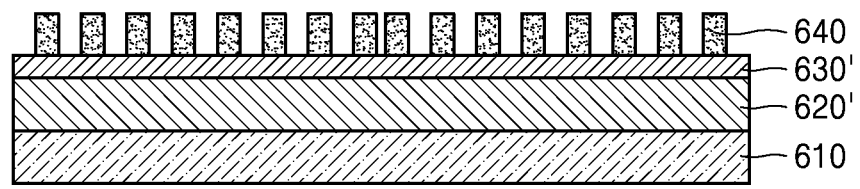

Referring to FIG. 39, the resin material that remains on the hard mask 630' is removed by performing an etching process by using the patterned resin layer 640 as a mask. Referring to FIG. 40, the hard mask 630' is patterned by using the patterned resin layer 640 as a mask, and then the patterned resin layer 640 is removed.

Figure 41:
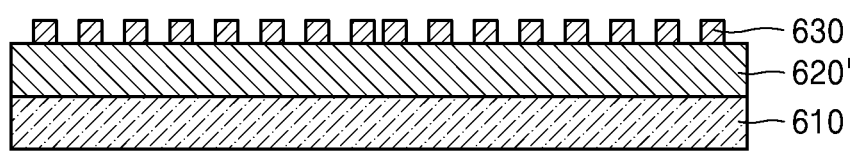
Figure 42:
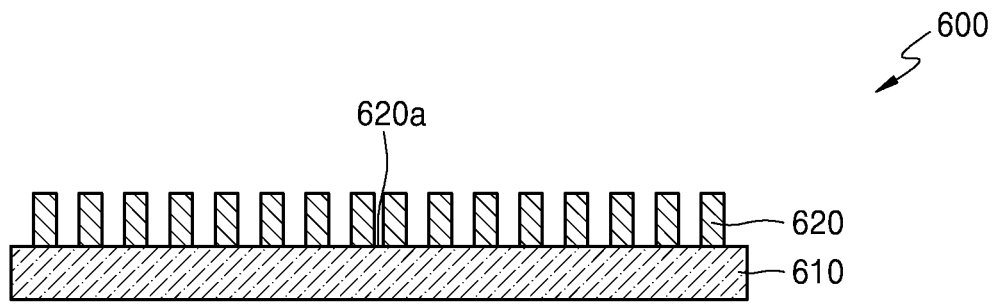

Then, as illustrated in FIG. 41, a patterned hard mask 630 may be formed on the metal layer 620'. Thereafter, the metal layer 620' is patterned by using the patterned hard mask 630 as a mask, and then the patterned hard mask 630 is removed. Then, as illustrated in FIG. 42, the metal wire grid polarizer 600 that includes a plurality of metal wire patterns 620 provided on the supporting substrate 610 may be completely manufactured. Herein, the metal wire patterns 620 may have patterns that are identical to the fine patterns P of the pattern structure 100. Accordingly, a part 620*a* that corresponds to a seam of the pattern structure 100 may be formed in the middle of the metal wire patterns 620.

Figure 43:
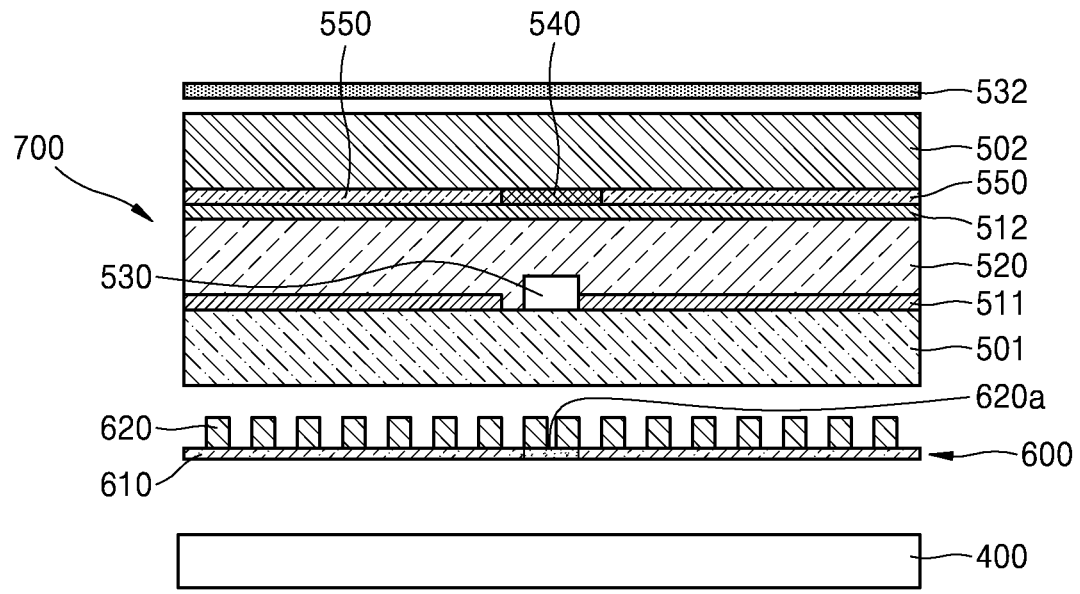
FIG. 43 is a cross-sectional view of an LCD apparatus including the metal wire grid polarizer manufactured using the method illustrated in FIGS. 37 to 42.

FIG. 43 is a cross-sectional view of an LCD apparatus 700 which includes the metal wire grid polarizer 600 that is manufactured by using the method illustrated in FIGS. 37 to 42.

Referring to FIG. 43, the LCD apparatus 700 may include a first substrate 501 and a second substrate 502, a liquid crystal layer 520 disposed between the first and second substrates 501 and 502, and a backlight unit 400 configured to emit light toward the liquid crystal layer 520. As described above in relation to FIG. 36, the LCD apparatus 700 may further include a plurality of first electrodes 511, a plurality of thin film transistors 530, a second electrode 512, a plurality of color filters 550, and a black matrix 540.

The LCD apparatus 700 may further include the metal wire grid polarizer 600 arranged to face the first substrate 501, and an absorptive polarizer 532 arranged to face the second substrate 502. Although the absorptive polarizer 532 is arranged to face the second substrate 502 and the metal wire grid polarizer 600 is arranged to face the first substrate 501 in FIG. 43, the locations of the absorptive polarizer 532 and the metal wire grid polarizer 600 are not limited thereto and may be switched. The metal wire grid polarizer 600 tends to reflect light that is polarized in parallel with respect to the metal wire patterns 620, and to transmit light that is polarized perpendicularly with respect to the metal wire patterns 620. For example, the metal wire grid polarizer 600 may reflect an S-polarized wave and transmit a P-polarized wave. Accordingly, when the metal wire grid polarizer 600 is used, by reusing the reflected S-polarized wave, a loss of light may be reduced and a brightness of the LCD apparatus 700 may be increased.

As illustrated in FIG. 43, the metal wire patterns 620 of the metal wire grid polarizer 600 may have a part 620a that corresponds to a seam of the pattern structure 100. In the LCD apparatus 700 according to the current exemplary embodiment, the seam part 620a of the metal wire patterns 620 may be disposed at a location that corresponds to the black matrix 540. As described above, the seam part 620a of the metal wire patterns 620 may have a width (e.g., equal to or less than 10 µm) which is less than the width of the black matrix 540. When the seam part 620a that has a width which is less than the width of the black matrix 540 is positioned to face the black matrix 540, since the seam part 620a is covered by the black matrix 540 and thus is not visible, an image that has no defects may be displayed in a large area.

Although the pattern structure 100 is manufactured by bonding two unit pattern structures, e.g., the first and second unit pattern structures 111 and 112, to each other in the above description, a larger-area pattern structure may be manufactured by bonding three or more unit pattern structures together. The number of unit pattern structures to be bonded may be variably determined based on the size of a wafer that is usable in a semiconductor patterning process and the size of a desired pattern structure to be manufactured.

Figure 44:
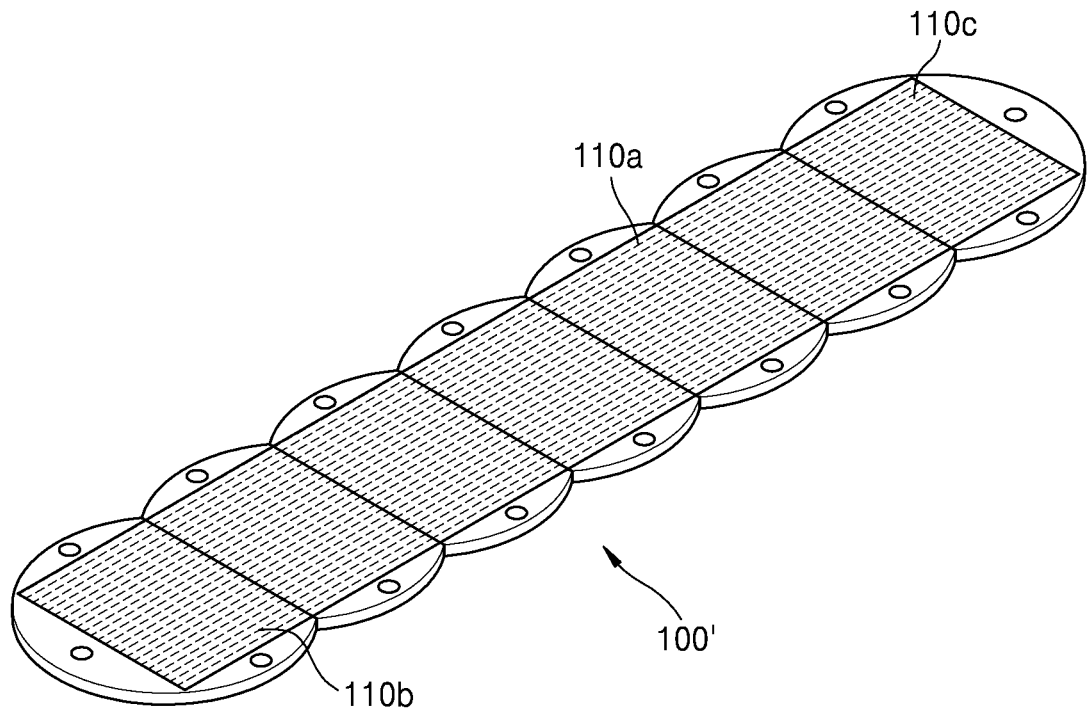
FIGS. 44 and 45 are perspective views of large-area pattern structures manufactured using a tiling technology, according to other exemplary embodiments.
Figure 45:
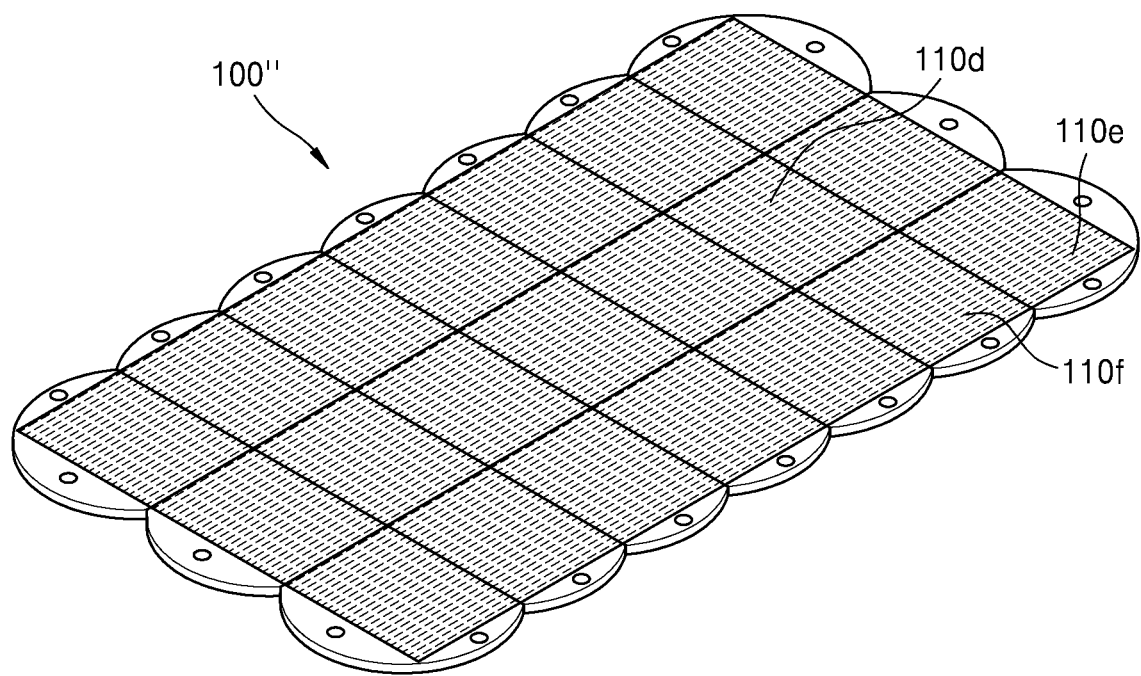

FIGS. 44 and 45 are perspective views of large-area pattern structures 100' and 100" manufactured using a tiling technology, according to other exemplary embodiments.

Referring to FIG. 44, the large-area pattern structure 100' may be manufactured by bonding a plurality of unit pattern structures 110a, 110b, and 110c to one another in a row. In FIG. 44, when the unit pattern structures 110a respectively disposed in the middle are manufactured, two edges of each wafer may be cut. When the unit pattern structures 110b and 110c respectively disposed at the two ends, only one edge of each wafer may be cut. Thereafter, all of the unit pattern structures 110a, 110b, and 110c may be provided on a single substrate 200 (see FIG. 26), and then the pattern structure 100' may be manufactured by using the method illustrated in FIGS. 26 to 33. After the pattern structure 100' is completely manufactured, the other edges of the wafers having alignment marks M may be removed as necessary. When the alignment marks M are removed, a general stealth dicing technology or another dicing technology may be used.

Referring to FIG. 45, the large-area pattern structure 100" may be manufactured by two-dimensionally arranging and bonding a plurality of unit pattern structures 110d, 110e, and 110f together. In FIG. 45, when the unit pattern structures 110d respectively disposed in the middle are manufactured, all edges of each wafer may be cut. When the unit pattern structures 110e respective disposed at the four corners, two neighboring edges of each wafer may be cut. When the unit pattern structures 110f respectively disposed along sides of the pattern structure 100", three edges of each wafer may be cut. Thereafter, all of the unit pattern structures 110d, 110e, and 110f may be provided on a single substrate 200 (see FIG. 26) and then the pattern structure 100" may be manufactured by using the method illustrated in FIGS. 26 to 33.

According to the above-described exemplary embodiments, a unit pattern structure may be manufactured by processing two surfaces of a wafer to form first and second trenches by using two blades. A cut surface of the unit pattern structure may include a first cut surface defined by the first trench, and a second cut surface defined by the second trench, and the first cut surface may protrude outward as compared with the second cut surface. As such, when a large-area pattern structure is manufactured by bonding unit pattern structures to each other by using a tiling technology, the size of seams generated between the unit pattern structures may be minimized. Therefore, defects may not be viewed on a large-area display panel having a nanoscale functional structure, such as a nanoscale grid or a wire grid polarizer. In addition, the unit pattern structure may be precisely manufactured to a desired shape by accurately processing a desired part of a first surface of the wafer by using a first blade.

It will be understood by persons having ordinary skill in the art that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A pattern structure comprising:
 a first surface that has a plurality of fine patterns thereon and a second surface which is opposite to the first surface; and
 a side surface that is disposed between the first surface and the second surface, and comprises a first cut surface and a second cut surface, the first cut surface being connected to the first surface and the second cut surface, and a second cut surface being connected to the second surface and the first cut surface,
 wherein the first cut surface protrudes outward as compared with the second cut surface, and
 wherein an angle between the first surface and the first cut surface is equal to or less than 90°.

2. The pattern structure of claim 1, wherein a length of the first cut surface is less than a length of the second cut surface.

3. The pattern structure of claim 1, wherein the angle between the first surface and the first cut surface is less than 90°.

4. A pattern structure comprising a plurality of component pattern structures bonded together, each of the component pattern structures comprising:
 a first surface that has a plurality of fine patterns thereon and a second surface which is opposite to the first surface; and
 a side surface that is disposed between the first surface and the second surface, and comprises a first cut surface and a second cut surface, the first cut surface being connected to the first surface, and a second cut surface being connected to the second surface and the first cut surface, wherein the first cut surface protrudes outward as compared with the second cut surface, and wherein an angle between the first surface and the first cut surface is equal to or less than 90°.

5. The pattern structure of claim 4, wherein a length of the first cut surface is less than a length of the second cut surface.

6. The pattern structure of claim 4, further comprising a resin layer prepared between and under each of the component pattern structures.

7. The pattern structure of claim 6, wherein each of the plurality of fine patterns has an equal height.

8. The pattern structure of claim 6, wherein a minimum gap between adjacent component pattern structures is greater than 0 μm and less than 10 μm.

* * * * *